United States Patent
Cao et al.

(10) Patent No.: US 9,589,667 B2
(45) Date of Patent: Mar. 7, 2017

(54) GATE DRIVE CIRCUIT AND DRIVE METHOD FOR THE SAME

(71) Applicants: Shanghai Tianma Micro-Electronics Co., Ltd., Shanghai (CN); Tianma Micro-Electronics Co., Ltd., Shenzhen (CN)

(72) Inventors: Zhaokeng Cao, Shanghai (CN); Tinghai Wang, Shanghai (CN); Dandan Qin, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 117 days.

(21) Appl. No.: 14/730,164

(22) Filed: Jun. 3, 2015

(65) Prior Publication Data

US 2016/0189799 A1 Jun. 30, 2016

(30) Foreign Application Priority Data

Dec. 31, 2014 (CN) .......................... 2014 1 0854026

(51) Int. Cl.
| | |
|---|---|
| *G11C 19/00* | (2006.01) |
| *G11C 19/28* | (2006.01) |
| *G09G 3/20* | (2006.01) |
| *G09G 3/36* | (2006.01) |

(52) U.S. Cl.
CPC ............ *G11C 19/287* (2013.01); *G09G 3/20* (2013.01); *G09G 3/3677* (2013.01); *G09G 2300/0408* (2013.01); *G09G 2310/0267* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 8,169,395 B2 * | 5/2012 | Jo ........................ | G09G 3/3677 345/100 |
| 2007/0216634 A1 * | 9/2007 | Kim ..................... | G09G 3/3677 345/100 |
| 2007/0247932 A1 * | 10/2007 | Tobita .................. | G09G 3/3677 365/189.12 |
| 2009/0167668 A1 * | 7/2009 | Kim ..................... | G09G 3/3677 345/100 |

(Continued)

FOREIGN PATENT DOCUMENTS

KR 1020080000041 B1 1/2008

*Primary Examiner* — Tuan T Lam
(74) *Attorney, Agent, or Firm* — Alston & Bird LLP

(57) ABSTRACT

A gate drive circuit is disclosed. The drive circuit includes M cascaded shift registers, where M is a natural number, and a clock controller configured to generate two reverse-phase clock signals. The drive circuit also includes a high level controller configured to generate a high level signal, and a low level controller configured to generate a low level signal, where one of the high level controller and the low level controller is configured to generate an initial pulse signal during an initial stage. The drive circuit also includes a start unit cascaded with the M shift registers, where the start unit is configured to provide a start signal to the shift registers.

23 Claims, 11 Drawing Sheets

(56) References Cited

U.S. PATENT DOCUMENTS

| | | | | |
|---|---|---|---|---|
| 2011/0142191 A1* | 6/2011 | Tobita | ............... | G09G 3/3677 377/64 |
| 2012/0188210 A1* | 7/2012 | Zhang | ............... | G09G 3/3677 345/204 |
| 2013/0148775 A1* | 6/2013 | Shin | ............ | G11C 19/28 377/69 |
| 2013/0169609 A1* | 7/2013 | Son | ............ | G11C 19/28 345/209 |

* cited by examiner

GATE DRIVE CIRCUIT AND DRIVE METHOD FOR THE SAME

CROSS-REFERENCES TO RELATED APPLICATIONS

This application claims the benefit of priority to Chinese Patent Application No. 201410854026.2, filed with the Chinese Patent Office on Dec. 31, 2014 and entitled "GATE DRIVE CIRCUIT AND DRIVE METHOD FOR THE SAME", the content of which is incorporated herein by reference in its entirety.

TECHNICAL FIELD

The disclosure relates to the field of display technology, and in particular to a gate drive circuit and a drive method for the same.

BACKGROUND OF THE INVENTION

A TFT array substrate of a display device such as a liquid crystal display device (LCD, Liquid Crystal Display), an organic light emitting display device (OLED, Organic Light Emitting Diode Display) or the like generally includes a gate drive circuit which provides a gate drive signal to the TFT array substrate. The gate drive circuit includes multiple shift registers, and there is a signal line for providing the drive signal to the multiple shift registers outside the gate drive circuit. The gate drive circuit and the multiple signal lines generally locate in a border region of the TFT array substrate. With the development of the technology, an area of the gate drive circuit is gradually reduced, a width of the signal line in the border region is gradually increased, how to reduce the area of the signal line has become a concerned point.

BRIEF SUMMARY OF THE INVENTION

One inventive aspect is a gate drive circuit. The drive circuit includes M cascaded shift registers, where M is a natural number, and a clock controller configured to generate two reverse-phase clock signals. The drive circuit also includes a high level controller configured to generate a high level signal, and a low level controller configured to generate a low level signal, where one of the high level controller and the low level controller is configured to generate an initial pulse signal during an initial stage. The drive circuit also includes a start unit cascaded with the M shift registers, where the start unit is configured to provide a start signal to the shift registers.

Another inventive aspect is a drive method for driving a gate drive circuit. The drive circuit includes M cascaded shift registers, where M is a natural number, and a clock controller configured to generate two reverse-phase clock signals. The drive circuit also includes a high level controller configured to generate a high level signal, and a low level controller configured to generate a low level signal, where one of the high level controller and the low level controller is configured to generate an initial pulse signal during an initial stage. The drive circuit also includes a start unit cascaded with the M shift registers, where the start unit is configured to provide a start signal to the shift registers. The drive method includes inputting the initial pulse signal and the two reverse-phase clock signals to the start unit during a starting stage of the start unit, and inputting the high level signal/low level signal and the two reverse-phase clock signals to the start unit during an outputting stage of the start unit.

DETAILED DESCRIPTION OF THE PREFERRED EMBODIMENTS

Figure 1:
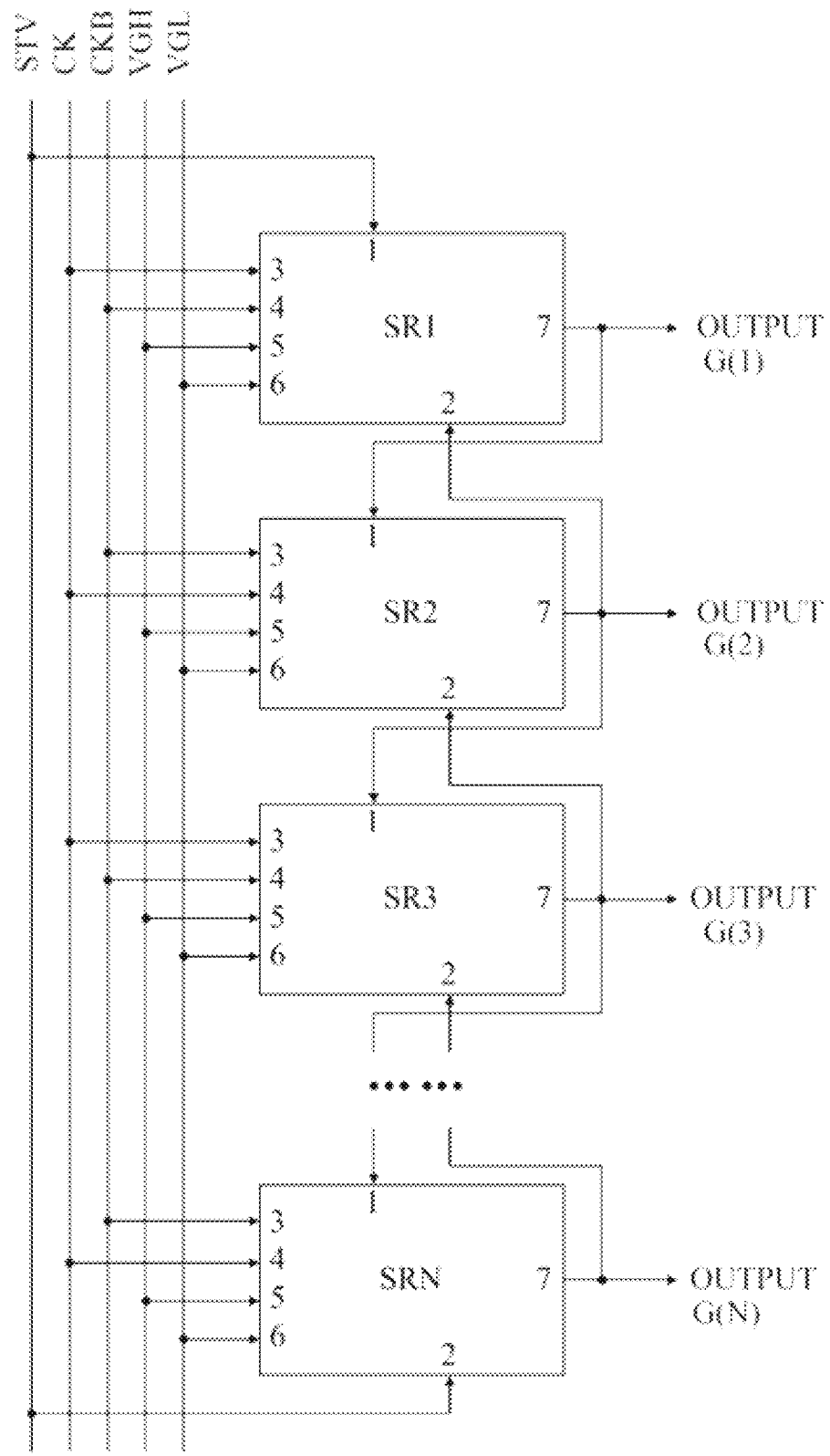
FIG. 1 is a cascade diagram of a gate drive circuit in the conventional art.

Reference is made to FIG. 1, which is a cascade diagram of a gate drive circuit in the conventional art. In FIG. 1, SR1 to SRN represent cascaded shift registers. SRn represents an n-th stage shift register, n is a natural number greater than 1 and less than N, and N is a natural number greater than 1. That is to say, the gate drive circuit is constituted by cascaded shift registers in the conventional art. As shown in FIG. 1, in the conventional art, each of the shift registers SR includes a first input terminal 1, a second input terminal 2, a third input terminal 3, a fourth input terminal 4, a fifth input terminal 5, a sixth input terminal 6 and a seventh input terminal 7. In the gate drive circuit, the first input terminal 1 of the first stage shift register SR1 is connected to a start control unit, a start signal STV is input to the first input terminal 1 of the first stage shift register SR1. The first input terminal 1 of the n-th stage shift register SRn other than the first stage shift register SR1 is connected to the seventh input terminal 7 of a (n−1)-th stage shift register SRn−1, an output signal of a former stage shift register is used as a start signal of a latter stage shift register. The second input terminal 2 of the n-th stage shift register SRn other than the last stage shift register SRN is connected to the seventh input terminal 7 of the latter stage shift register SRn+1, the output signal of the latter stage shift register SRn+1 is used as a reset signal of the n-th stage shift register SRn. The second input terminal 2 of the last stage shift register SRN is connected to the start control unit, the start signal STV is input to the second input terminal 2 of the last stage shift register SRN as the reset signal of the last stage shift register SRN. The output signal of the seventh input terminal 7 of each of the shift registers is used as a scan signal G(n) of each scan line in an array substrate.

Continuing to refer to FIG. 1, in the gate drive circuit in the conventional art, the third input terminal 3 of the n-th stage shift register SRn is connected to one of two reverse-phase clock signal CK and CKB, and the fourth input terminal 4 of the n-th stage shift register SRn is connected to the other one of the two reverse-phase clock signal CK and CKB. And for each of the shift registers: the clock signal input to the third input terminal 3 is different from the clock signal input to the fourth input terminal 4; the clock signal input to the third input terminal 3 is different from the clock signal input to the third input terminal 3 of a neighbor stage shift register; and the clock signal input to the fourth input terminal 4 is different from the clock signal input to the fourth input terminal 4 of the neighbor stage shift register. The fifth input terminal 5 of the n-th stage shift register SRn is connected to a high level controller, and a high level signal VGH is input to the fifth input terminal 5 of the n-th stage shift register SRn. The sixth input terminal 6 of the n-th stage shift register SRn is connected to a low level controller, and a low level signal VGL is input to the sixth input terminal 6 of the n-th stage shift register SRn.

According to the gate drive circuit shown in FIG. 1, each scan line in the array substrate may begin to scan through a scan input of each of the shift registers, thereby a display function of the array substrate is implemented. However, in the gate drive circuit in the conventional art shown in FIG. 1, there are numerous signal lines such as a start signal line, a high level signal line, a low level signal line and a clock signal line or the like, the width of the signal lines in the border region is great.

In view of this, there are provided a gate drive circuit and a drive method for driving the gate drive circuit according to the embodiments of the disclosure. In the gate drive circuit and the drive method, the initial pulse signal generated by a trip of the high level controller or the low level controller is input to a start unit, the start unit generates a start signal and inputs the start signal to a shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved.

To make the above object, features and advantages of the disclosure more obvious and easy to be understood, in the following, the disclosure will be illustrated in detail in conjunction with the drawings and embodiments of the disclosure.

It should be noted that more specific details will be set forth in the following descriptions for sufficient understanding of the disclosure, however the disclosure can also be implemented by other ways different from the way described herein, similar extensions can be made by those skilled in the art without departing from the spirit of the disclosure, therefore the invention is not limited to particular embodiments disclosed hereinafter.

Figure 2:
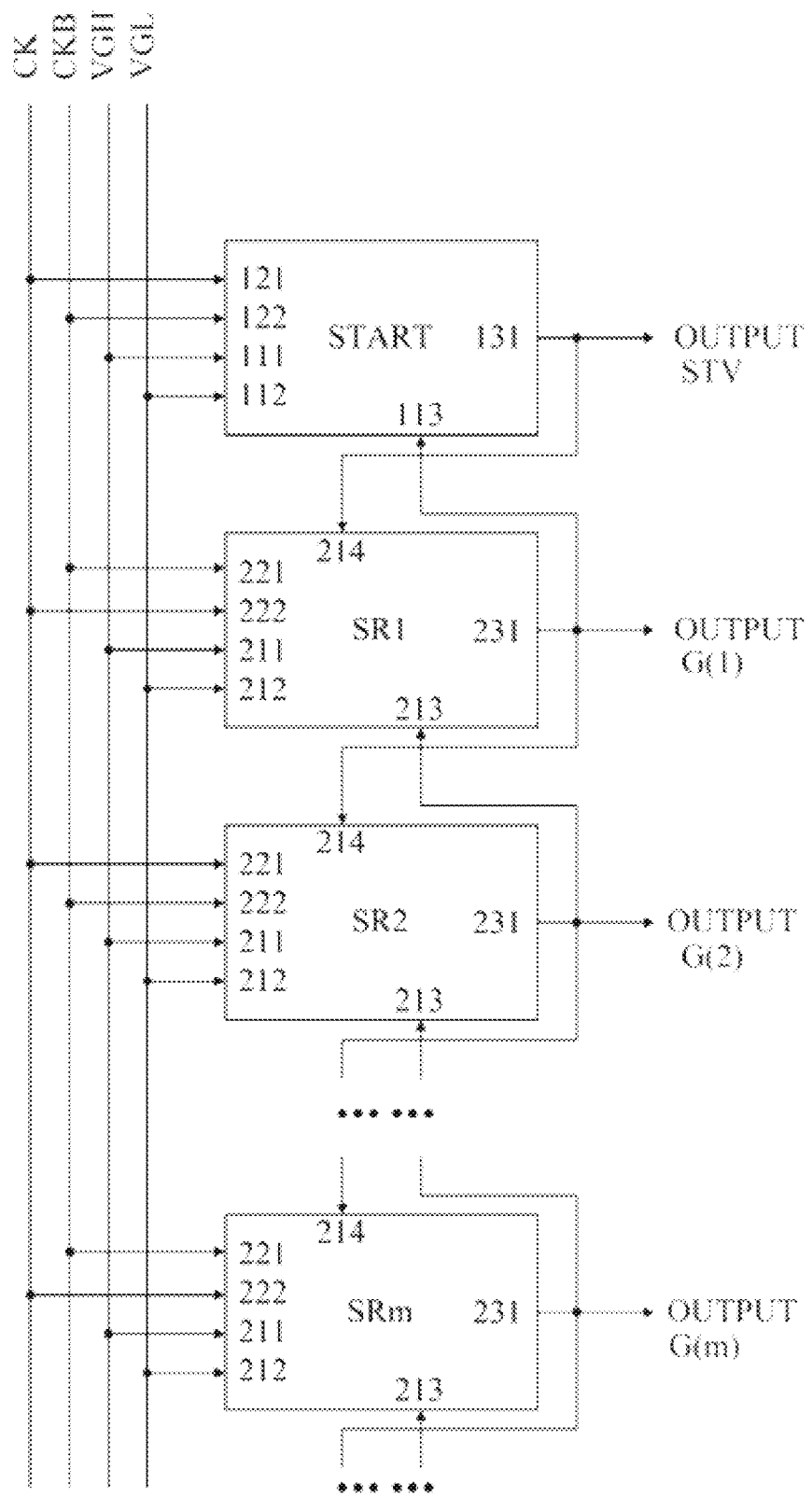
FIG. 2 is a cascade diagram of a gate drive circuit according to an embodiment of the disclosure.

Reference is made to FIG. 2, which is a cascade diagram of a gate drive circuit according to an embodiment of the disclosure. As shown in FIG. 2, the gate drive circuit according to the embodiment of the disclosure includes: M cascaded shift registers; a clock controller, configured to generate two reverse-phase clock signals CK and CKB; a high level controller configured to generate a high level signal VGH and a low level controller configured to generate a low level signal VGL, where the high level controller or the low level controller generates an initial pulse signal during an initial stage; and a start unit START cascaded with the M shift registers, configured to provide a start signal STV to the shift registers, where M is a natural number.

Continuing to refer to FIG. 2, in the embodiment, the start unit START includes a first input terminal 111 and a second input terminal 112. The first input terminal 111 is connected to the high level controller to input the high level signal VGH and the initial pulse signal. The initial pulse signal is provided by the high level controller during the initial stage, and the initial pulse signal is reverse-phase with a non-initial stage signal in the signal line. During the non-initial stage, the first input terminal 111 is connected to the high level controller, that is, the signal input to the first input terminal 111 is the high level signal VGH, the initial pulse signal is a low level pulse signal. The second input terminal 112 is connected to the low level controller to input the low level signal VGL. The start unit START further includes a third input terminal 113, a first clock terminal 121 and a second clock terminal 122. The first clock terminal 121 is connected to the clock controller to input one of the two reverse-phase clock signals CK and CKB, and the second clock terminal 122 is connected to the clock controller to input the other one of the two reverse-phase clock signals CK and CKB. A first clock signal CK is input to the first clock terminal 121 as a drive level of the start unit START. A second clock signal CKB is input to the second clock terminal 122. The second clock signal CKB is reverse-phase with the first clock signal CK, that is, the second clock signal CKB is the low level signal in the case that the first clock signal CK is the high level signal, and the second clock signal CKB is the high level signal in the case that the first clock signal CK is the low level signal. The start unit START further includes a first output terminal 131, the first output terminal 131 is configured to output the start signal STV generated by the start unit START.

Continuing to refer to FIG. 2, an m-th stage shift register SRm is taken as an example. In the embodiment, the m-th stage shift register SRm includes an a-th input terminal 211 and a b-th input terminal 212. The signal input to the a-th input terminal 211 is the same as the signal input to the first input terminal 111 of the start unit START. That is, the a-th input terminal 211 is also connected to the high level controller, and the high level signal VGH is input to the a-th input terminal 211. The signal input to the b-th input terminal 212 is the same as the signal input to the second input terminal 112 of the start unit START. That is, the b-th input terminal 212 is also connected to the low level controller, and the low level signal VGL is input to the b-th input terminal. The m-th stage shift register SRm further includes a c-th input terminal 213, a d-th input terminal 214, an a-th clock terminal 221 and a b-th clock terminal 222. The d-th input terminal 214 of the first stage shift register SR1 is connected to the first output terminal 131 of the start unit START to input the start signal STV to the first stage shift register SR1 as the start signal for causing the first stage shift register SR1 to run. The a-th clock terminal 221 is connected to the clock controller, one of the two reverse-phase clock signals CK and CKB is input to the a-th clock terminal 221; and the b-th clock terminal 222 is connected to the clock controller, the other one of the two reverse-phase clock signals CK and CKB is input to the b-th clock terminal 222. The first clock signal CK is input to the a-th clock terminal 221 as the drive level of the m-th stage shift register SRm. The second clock signal CKB is input to the b-th clock terminal 222. The second clock signal CKB is reverse-phase with the first clock signal CK, that is, the second clock signal CKB is a low level signal in the case that the first clock signal CK is a high level signal, and the second clock signal CKB is a high level signal in the case that the first clock signal CK is a low level signal. It should be noted that, the clock signal input to the a-th clock terminal 221 of the m-th stage shift register SRm is reverse-phase with the signal input to the a-th clock terminal 221 of the neighbor stage shift register of the m-th stage shift register SRm i.e. the (m−1)-th stage shift register SRm−1 or the (m+1)-th stage shift register SRm+1. And the clock signal input to the b-th clock terminal 222 of the m-th stage shift register SRm is reverse-phase with the signal input to the b-th clock terminal 222 of the neighbor stage shift register of the m-th stage shift register SRm. i.e. the (m−1)-th stage shift register SRm−1 or the (m+1)-th stage shift register SRm+1. That is, the second clock signal CKB is input to the a-th clock terminal 221 of the (m−1)-th stage shift register SRm−1 and the (m+1)-th stage shift register SRm+1 as the drive level of the (m−1)-th stage shift register SRm−1 and the (m+1)-th stage shift register SRm+1 in the case that the first clock signal CK is input to the a-th clock terminal 221 of the m-th stage shift register SRm as the drive level of the m-th stage shift register SRm. The m-th stage shift register SRm further includes an a-th output terminal 231, the a-th output terminal 231 is configured to output a gate drive signal G(m) generated by the m-th stage shift register SRm.

More specifically, it may be seen from FIG. 2 that the a-th output terminal 231 of the first stage shift register SR1 is connected to the third input terminal 113 of the start unit START to input the output signal G(1) of the first stage shift register SR1 to the start unit START as a reset signal of the start unit START. The a-th output terminal 231 of each of the shift registers other than the first stage shift register SR1 is connected to the c-th input terminal 213 of the former stage shift register. That is, the a-th output terminal 231 of the m-th stage shift register SRm is connected to the c-th input terminal 213 of the (m−1)-th stage shift register SRm−1 to input the output signal G(m) of the m-th stage shift register SRm to the (m−1)-th stage shift register SRm−1 as the reset signal. The a-th output terminal 231 of each of the shift registers is connected to the d-th input terminal 214 of the latter stage shift register. That is, the a-th output terminal 231 of the m-th stage shift register SRm is connected to the d-th input terminal 214 of the (m+1)-th stage shift register SRm+1 to input the output signal G(m) of the m-th stage shift register SRm to the latter stage shift register SRm+1 as the start signal.

Figure 3A:
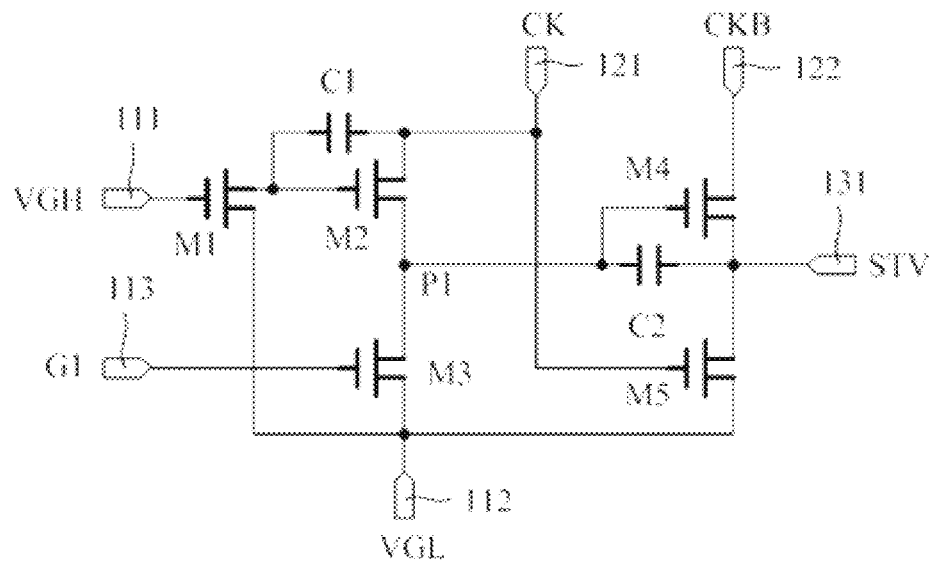
FIG. 3a is a circuit diagram of a start unit of the gate drive circuit in FIG. 2.
Figure 3B:
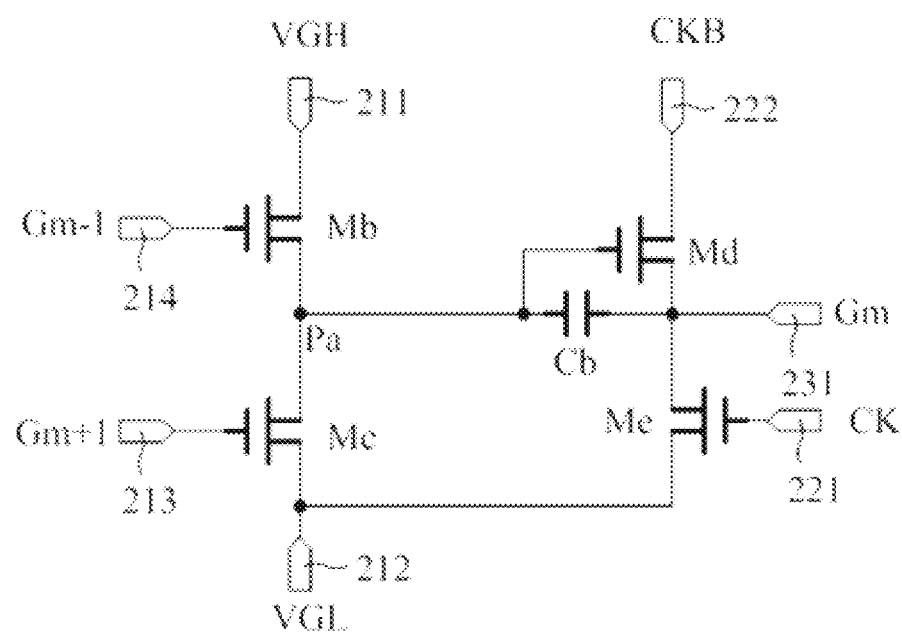
FIG. 3b is a circuit diagram of an m-th stage shift register of the gate drive circuit in FIG. 2.

More specifically, reference is made to FIG. 3a and FIG. 3b. FIG. 3a is a circuit diagram of a start unit of the gate drive circuit in FIG. 2 and FIG. 3b is a circuit diagram of an m-th stage shift register of the gate drive circuit in FIG. 2.

Referring to FIG. 2 and FIG. 3a, the start unit START of the gate drive circuit according to the embodiment includes a first transistor M1, a second transistor M2 and a first capacitor C1. A gate of the first transistor M1 is connected to the first input terminal 111, and a drain of the first transistor M1 is connected to the second input terminal 112. The gate of the second transistor M2 is connected to a source of the first transistor M1, and the source of the second transistor M2 is connected to the first clock terminal 121. The first capacitor C1 is connected between the source of the first transistor M1 and the first clock terminal 121.

More specifically, continuing to refer to FIG. 3a, the start unit START of the gate drive circuit according to the embodiment further includes a third transistor M3, a fourth transistor M4, a fifth transistor M5 and a second capacitor C2. The gate of the third transistor M3 is connected to the third input terminal 113, the source of the third transistor M3 is connected to the drain of the second transistor M2 at a pull-up node P1 of the start unit START, and the drain of the third transistor M3 is connected to the second input terminal 112. The gate of the fourth transistor M4 is connected to the drain of the second transistor M2 i.e. the pull-up node P1, the source of the fourth transistor M4 is connected to the second clock terminal 122, and the drain of the fourth transistor M4 is connected to the first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

Referring to FIG. 3b, the shift register SR of the gate drive circuit according to the embodiment includes a b-th transistor Mb, a c-th transistor Mc, a d-th transistor Md, an e-th transistor Me and a b-th capacitor Cb. The gate of the b-th transistor Mb is connected to the d-th input terminal 214, and the source of the b-th transistor Mb is connected to the a-th input terminal 211. The gate of the c-th transistor Mc is connected to the c-th input terminal 213, the source of the c-th transistor Mc is connected to the drain of the b-th transistor Mb at a pull-up node Pa of the shift register SR, and the drain of the c-th transistor Mc is connected to the b-th input terminal 212. The gate of the d-th transistor Md is connected to the drain of the b-th transistor Mb i.e. the pull-up node Pa, the source of the d-th transistor Md is connected to the b-th clock terminal 222, and the drain of the d-th transistor Md is connected to the a-th output terminal 231. The gate of the e-th transistor Me is connected to the a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb i.e. the pull-up node Pa and the a-th output terminal 231.

Note that the transistor in the gate drive circuit according to the embodiment is a NMOS transistor, which has a characteristic of low voltage cut-off and high voltage turn-on. However, in other embodiments of the present disclosure, a PMOS transistor may be used as the electronic element of the drive circuit. The PMOS transistor has a characteristic of low voltage turn-on and high voltage cut-off. Accordingly, the circuit connection is little changed in the case that the PMOS transistor is used as the electronic element of the drive circuit. Description is made by taking the gate drive circuits shown in FIG. 2, FIG. 3a and FIG. 3b as examples. In the case that the PMOS transistor is used as the electronic element of the drive circuit, the start unit START includes the first input terminal 111 and the second input terminal 112. The first input terminal 111 is connected to the low level controller to input the low level signal VGL and the initial pulse signal. In this case, the initial pulse signal is a high level pulse signal since the characteristic of the transistor is changed. The second input terminal 112 is connected to the high level controller, the high level signal VGH is input to the second input terminal 112. Correspondingly, in the shift register, the a-th input terminal 211 is connected to the low level controller, the low level signal VGL is input to the a-th input terminal 211; and the b-th input terminal 212 is connected to the high level controller, the high level signal VGH is input to the b-th input terminal 212. In the start unit START and the shift register SR, the connection of the clock signal is reverse with the connection of the clock signal in the embodiment. That is, in the start unit START, the first clock terminal 211 is connected to the second clock signal CKB, and the second clock terminal 212 is connected to the first clock signal CK. The connection of the clock signal in the shift register SR is changed correspondingly, which is not described herein. The present embodiment is merely an example description of the disclosure, and the specific configuration of the electronic element shown in the embodiment should not be regarded as a limitation of the disclosure.

Figure 4:
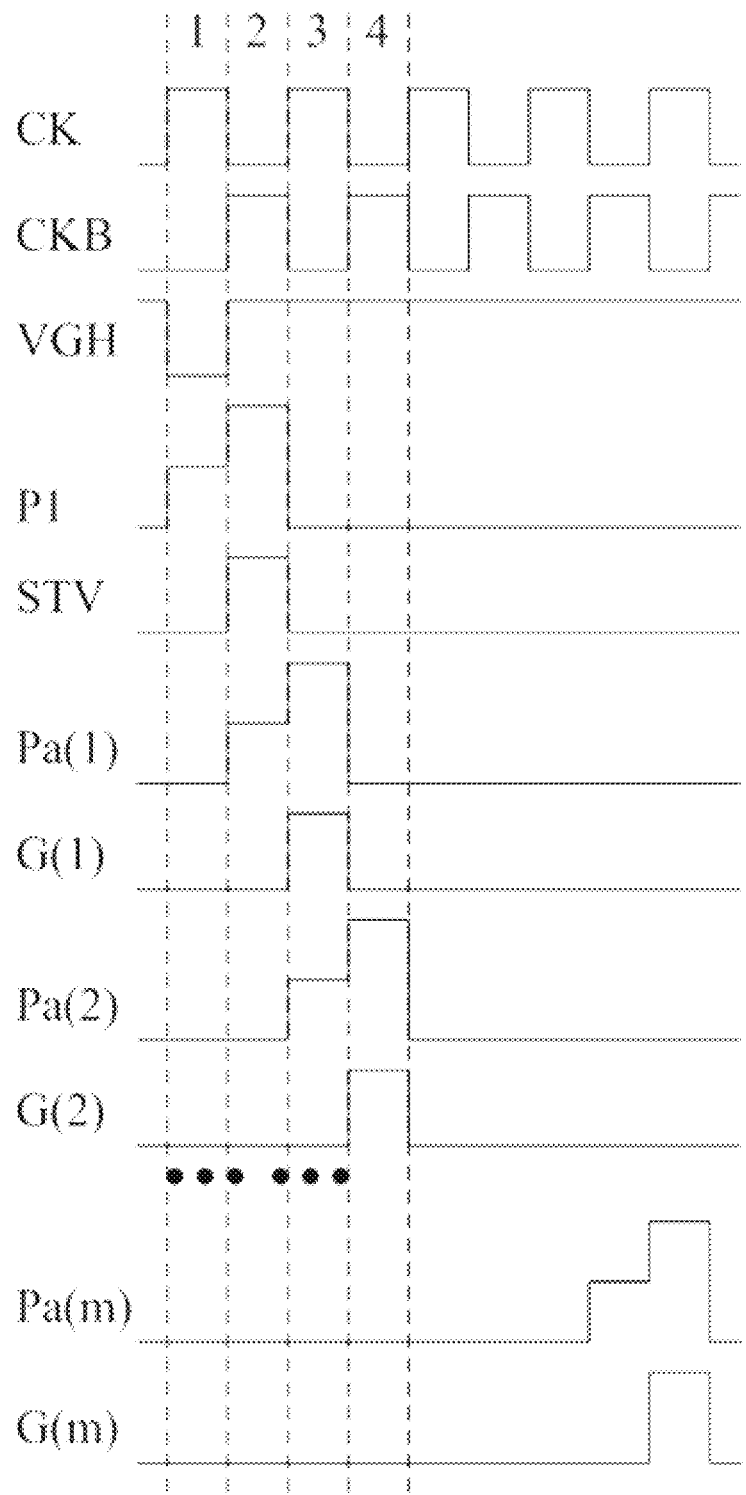
FIG. 4 is a signal sequence diagram of the gate drive circuit in FIG. 2.

It is also provided a drive method for driving the gate drive circuit as shown in FIG. 2 according to the embodiment of the disclosure. Reference is made to FIG. 4, which is a signal sequence diagram of the gate drive circuit in FIG. 2. G(m) represents an output signal OUTPUT of the m-th stage shift register SRm, STV represents an output signal OUTPUT of the start unit START. The drive method according to the embodiment includes a starting stage of a start unit and an outputting stage of the start unit START. The initial pulse signal and the two reverse-phase clock signals CK and CKB are input to the start unit START during the starting stage; and the high level signal/low level signal and the two reverse-phase clock signals CK and CKB are input to the start unit START during the outputting stage, and the first output terminal 131 outputs the start signal STV. The starting stage and the outputting stage of the start unit START are scanning stage of the start unit START.

In particular, referring to FIG. 2, FIG. 3a, FIG. 3b and FIG. 4. During a first time period 1 i.e. the starting stage of the start unit START, the first clock signal CK is a high level signal, the second clock signal CKB is reverse-phase with the first clock signal CK and is a low level signal. During the starting stage of the start unit START, the high level signal VGH jumps to generate the initial pulse signal, which is the low level pulse signal. In this case, the gate of the first transistor M1 is connected to the first input terminal 111, the low level pulse signal is input to the first transistor M1, and the first transistor M1 is cut-off, the source and drain of the first transistor M1 is not turn-on, the low level signal VGL input by the second input terminal 112 connected to the first transistor M1 may not be transmitted to the source of the first transistor M1. During the starting stage of the start unit START, the first clock terminal 121 inputs the high level signal of the first clock signal CK, a source voltage of the first transistor M1 is raised due to the function of the first capacitor C1, that is, the gate of the second transistor M2 is at the high voltage, the second transistor M2 is turn-on, the high level signal of the first clock signal CK is transmitted to P1, P1 is at the high level, that is, the precharge of P1 is completed. That is, during the first time period 1, the initial pulse signal is a low level signal, the signal input to the first clock terminal 121 is a high level signal and is reverse-phase with the initial pulse signal, and the signal input to the second clock terminal 122 is in-phase with the initial pulse signal.

During a second time period 2 i.e. the outputting stage of the start unit START, the second clock signal CKB is a high level signal, the first clock signal CK a low level signal, and the high level signal VGH jumps to be the high level. In this case, the first transistor M1 is turn-on, the low level signal VGL is transmitted to the source of the first transistor M1, the second transistor M2 is cut-off, the low level signal of the first clock signal CK may not be transmitted to P1, P1 remains at the high level, the fourth transistor M4 is turn-on, and the high level signal of the second clock signal CKB is transmitted to the drain of the fourth transistor M4. The voltage of the P1 i.e. the gate of the fourth transistor M4 is further raised through the second capacitor C2, that is, a gate voltage of the fourth transistor M4 is further raised, and the first output terminal 131 outputs the start signal STV.

For the first stage shift register SR1, since the first stage shift register SR1 is close to the start unit START, the a-th clock terminal 221 of the first stage shift register SR1 is connected to the second clock signal CKB, and the b-th clock terminal 222 is connected to the first clock signal CK. During the second time period 2, the STV signal is a high level signal, the d-th input terminal 214 of the first stage shift register SR1 is connected to the first output terminal 131 of the start unit START, the STV signal is input to the d-th input terminal of the first stage shift register SR1, the b-th transistor Mb of the first stage shift register SR1 is turn-on, the high level signal VGH is input to Pa through the a-th input terminal 211. That is, during the second time period 2, Pa maintains the high level, the precharge of Pa is completed. That is, the second time period 2 is a precharge stage of the first stage shift register SR1. In this case, the b-th clock terminal 222 is connected to the first clock signal CK, the first clock signal CK during the second time period 2 is a low level signal, thereby there is no signal output by the d-th transistor Md. During a third time period 3, Pa is at the high level, the d-th transistor Md is turn-on, the first clock signal CK is a high level signal, the first clock signal CK is transmitted to the drain of the d-th transistor Md through the d-th transistor Md. The voltage of Pa is further raised due to the function of the b-th capacitor Cb. That is, the gate voltage of the d-th transistor Md is further raised, the first clock signal CK is transmitted to the a-th output terminal 231, the a-th output terminal 231 outputs the signal G(1). That is, the third time period 3 is an outputting state of the first stage shift register SR1. The precharge stage of the first stage shift register SR1 and the outputting stage of the first stage shift register SR1 are the scanning stage of the first stage shift register SR1.

For the start unit START, during the third time period 3, the signal G(1) is input through the third input terminal 3, the third transistor M3 is turn-on, the low level signal VGL is transmitted to P1 through the third transistor M3. In this case, the fourth transistor M4 is cut-off, the second clock signal CKB may not be transmitted through the fourth transistor M4. That is, the start unit START is reset, the third time period 3 is a resetting state of the start unit START. During the latter time period, the fourth transistor M4 is cut-off since the P1 is reduced, the input to the first output terminal 131 maintains the low level, and does not change as the second clock signal CKB changes.

For the second stage shift register SR2, similarly to the first stage shift register SR1, during the third time period 3, the precharge of Pa of the second stage shift register SR2 is completed. And during a fourth time period 4, the second stage shift register SR2 outputs the output signal G(2), and resets the first stage shift register SR1 through the output signal G(2). For the cascaded shift registers, the scan and reset for the first stage shift register SR1 is performed on other shift registers, the precharge, signal output and reset are performed, the gate drive circuit is scanned stage by stage, which is not described herein.

According to the gate drive circuit and the drive method for the same provided by the embodiments, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved.

Figure 5A:
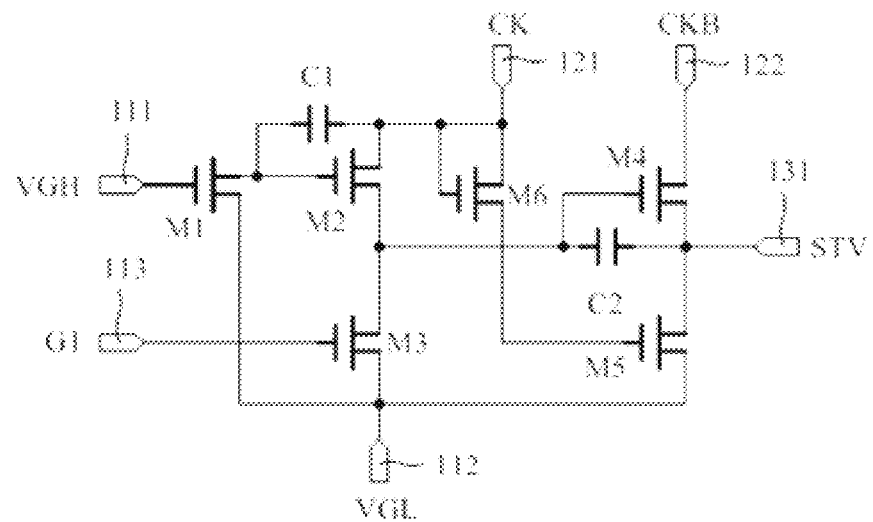
FIG. 5a is a circuit diagram of a start unit of another gate drive circuit according to the embodiment of the disclosure.

Reference is made to FIG. 5a, which is a circuit diagram of a start unit of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit START, and the drain of the third transistor M3 is connected to the second input terminal 112. The gate of the fourth transistor M4 is connected to the drain of the second transistor M2 i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes a sixth transistor M6, the gate and the source of the sixth transistor M6 are connected, the gate of the sixth transistor M6 is connected to the first clock terminal 121, and the drain of the sixth transistor M6 is connected to the gate of the fifth transistor M5.

Compared with the start unit shown in FIG. 3a, the start unit of the gate drive circuit according to the embodiment further includes the sixth transistor M6. During and after a resetting stage of the start unit, that is, during a non-scanning stage of the start unit, in the case that the signal input to the first clock terminal 121 is a high level signal, the sixth transistor M6 is turn-on, the high level signal is input to the gate of the fifth transistor M5, the fifth transistor M5 is turn-on, and a low level signal VGL is output to the first output terminal 131. In the case that the signal input to the first clock terminal 121 is a low level signal, the sixth transistor M6 is cut-off, the low level signal may not be input to the gate of the fifth transistor M5, the gate of the fifth transistor M5 maintains a high level at which the gate of the fifth transistor M5 is during a former time period, the fifth transistor M5 keeps in the on-state, the low level signal VGL is output to the first output terminal 131. According to the above start unit, the first output terminal 131 may maintain a low voltage after an outputting stage of the start unit, thereby a stability of the first output terminal 131 during a non-outputting stage of the start unit is improved.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability during the start unit non-scanning stage is improved, thereby the display effect is improved.

Figure 5B:
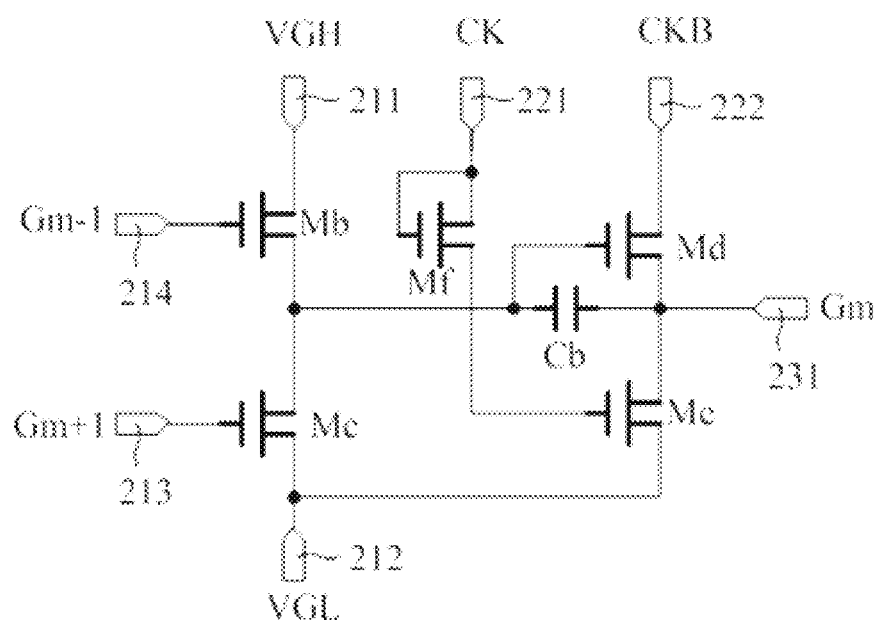
FIG. 5b is a circuit diagram of an m-th stage shift register of another gate drive circuit according to the embodiment of the disclosure.

Reference is made to FIG. 5b, which is a circuit diagram of an m-th stage shift register of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The shift register of the gate drive circuit according to the embodiment includes a b-th transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb i.e. the pull-up node Pa and the a-th output terminal 231.

The shift register of the gate drive circuit according to the embodiment further includes an f-th transistor Mf, the gate and the source of the f-th transistor Mf are connected, the gate of the f-th transistor Mf is connected to the a-th clock terminal 221, and the drain of the f-th transistor Mf is connected to the gate of the e-th transistor Me.

Similarly, compared with the shift register shown in FIG. 3b, the shift register of the gate drive circuit according to the embodiment further includes the f-th transistor Mf. After the shift register outputs the signal, and during a non-scanning stage of the shift register, in the case that the signal input to the a-th clock terminal 221 is a high level signal, the f-th transistor Mf is turn-on, the high level signal is input to the gate of the e-th transistor Me, the e-th transistor Me is turn-on, and a low level signal VGL is output to the a-th output terminal 231. In the case that the signal input to the a-th clock terminal 221 is a low level signal, the f-th transistor Mf is cut-off, the low level signal may not be input to the gate of the e-th transistor Me, the gate of the e-th transistor Me maintains a high level at which the gate of the e-th transistor Me is during a former time period, the e-th transistor Me maintains turn-on, the low level signal VGL is output to the a-th output terminal 231. According to the above shift register, the a-th output terminal 231 may maintain a low level after a scanning stage of the shift register, thereby a stability of the a-th output terminal 231 during a shift register non-scanning stage is improved.

It should be noted that the circuit structures of the start unit and the shift register according to the embodiment are merely schematic illustration. In practice, the circuit structures of the start unit and the shift register is not limited. For example, the shift register shown in FIG. 5b may be used in the case that the start unit shown in FIG. 5a is used. Alternatively, the shift register shown in FIG. 3b rather than the shift register shown in FIG. 5b may be used in the case that the start unit shown in FIG. 5a is used. The detailed description in the embodiment is not intended to limit the present disclosure.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability during the shift register non-scanning stage is improved, thereby the display effect is improved.

Figure 6A:
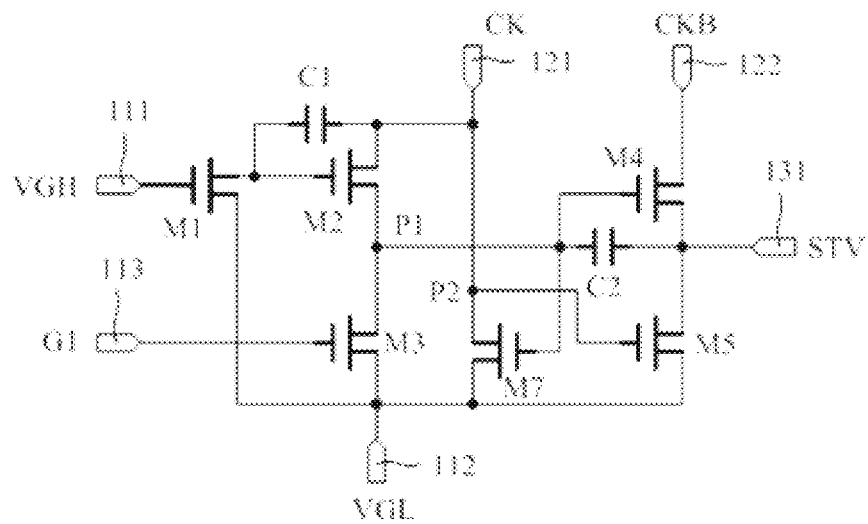
FIG. 6a is a circuit diagram of a start unit of another gate drive circuit according to the embodiment of the disclosure.

Reference is made to FIG. 6a, which is a circuit diagram of a start unit of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit, and the drain of the third transistor M3 is connected to the second input terminal 112. The gate of the fourth transistor M4 is connected to the drain of the second transistor M2 i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes a seventh transistor M7, the gate of the seventh transistor M7 is connected to the drain of the second transistor M2, the source of the seventh transistor M7 is connected to the gate of the fifth transistor M5, and the drain of the seventh transistor M7 is connected to the second input terminal 112.

According to the start unit in the embodiment, during a starting stage of the start unit and an outputting stage of the start unit, in the case that P1 is at a high voltage, the seventh transistor M7 is turn-on, and a low level signal VGL is input to P2, P2 is at a low level, the fifth transistor M5 is cut-off, and the first output terminal 131 does not discharges, thereby a stability of the output of the STV is ensured.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability of the output during the start unit scanning stage is improved, thereby the display effect is improved.

Figure 6B:
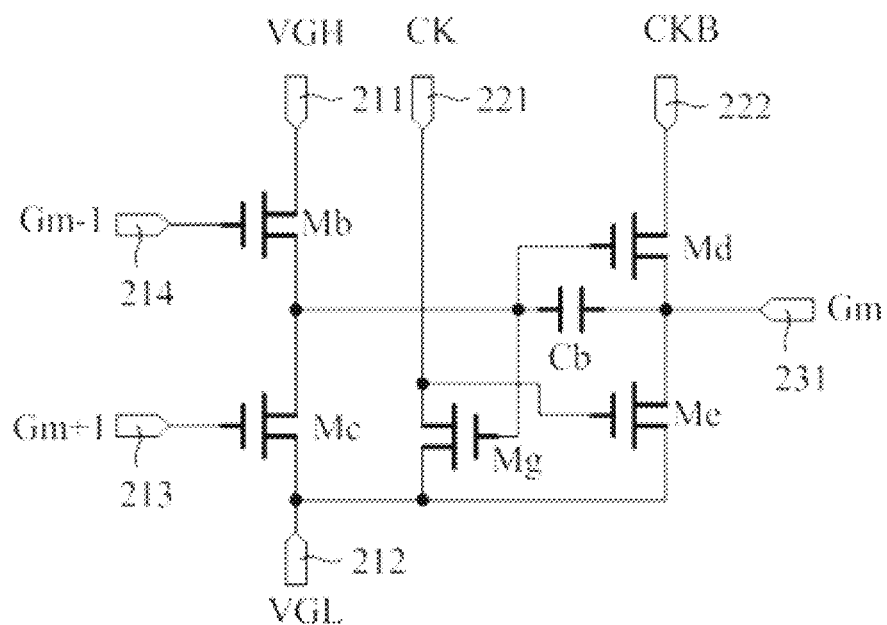
FIG. 6b is a circuit diagram of an m-th stage shift register of another gate drive circuit according to the embodiment of the disclosure.

Reference is made to FIG. 6b, which is a circuit diagram of an m-th stage shift register of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The shift register of the gate drive circuit according to the embodiment includes a b-th transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb, i.e. the pull-up node Pa and the a-th output terminal 231.

The shift register of the gate drive circuit according to the embodiment further includes a g-th transistor Mg, the gate of the g-th transistor Mg is connected to the drain of the b-th transistor Mb, the source of the g-th transistor Mg is connected to the gate of the e-th transistor Me, and the drain of the g-th transistor Mg is connected to the b-th input terminal 212.

According to the shift register in the embodiment, during a precharge stage of the shift register and a scanning stage of the shift register, in the case that Pa is at a high level, the g-th transistor Mg is turn-on, and a low level signal VGL is input to Pb, Pb is at a low level, the e-th transistor Me is cut-off, and the a-th output terminal 231 does not discharges, thereby a stability of the output of G(m) is ensured.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability of the output during the shift register scanning stage is improved, thereby the display effect is improved.

Figure 7A:
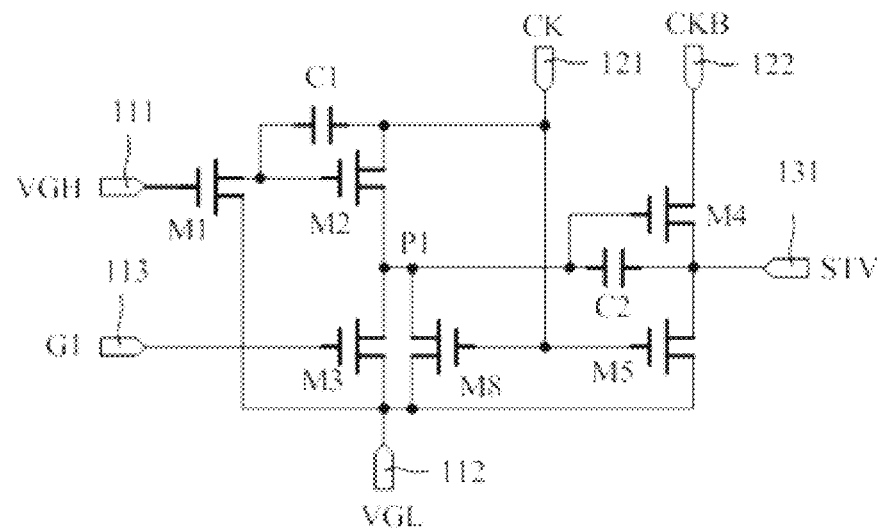
FIG. 7a is a circuit diagram of a start unit of another gate drive circuit according to the embodiment of the disclosure.

Reference is made to FIG. 7a, which is a circuit diagram of a start unit of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit, and the drain of the third transistor M3 is connected to the second input terminal 112. The gate of the fourth transistor M4 is connected to the drain of the second transistor M2 i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes an eighth transistor M8, the gate of the eighth transistor M8 is connected to the gate of the fifth transistor M5, the source of the eighth transistor M8 is connected to the drain of the second transistor M2, and the drain of the eighth transistor M8 is connected to the second input terminal 112.

According to the start unit in the embodiment, during a non-scanning stage of the start unit, in the case that a high level signal is input to the first clock terminal 121, the eighth transistor M8 is cut-off, a low level signal VGL input to the second input terminal 112 is input to P1, the level of P1 during a non-outputting stage of the start unit is reduced several times with the change of the first clock terminal 121, thereby a stability of the start unit circuit is improved.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability of the start unit circuit is improved, thereby the display effect is improved.

Figure 7B:
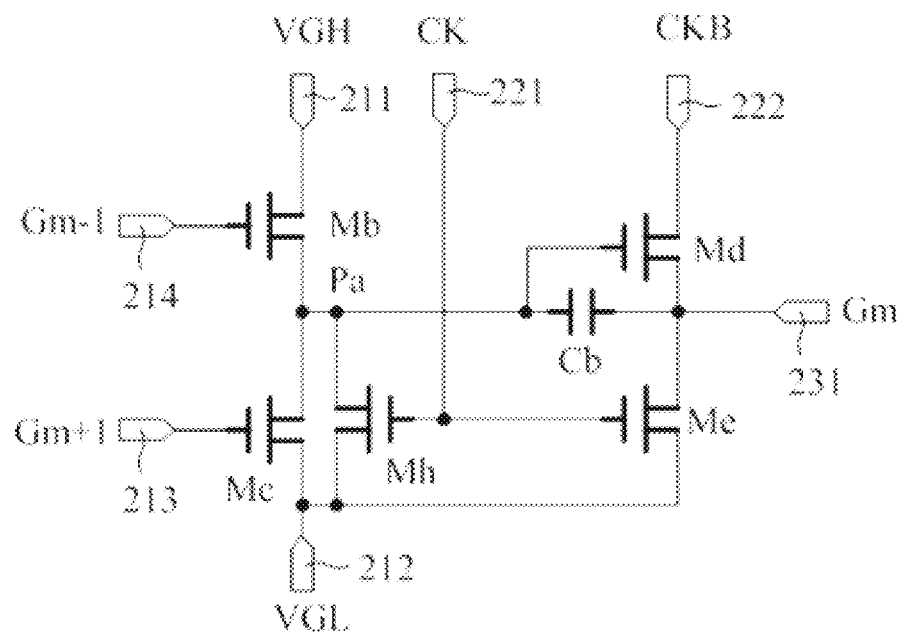
FIG. 7b is a circuit diagram of an m-th stage shift register of another gate drive circuit according to the embodiment of the disclosure.

Reference is made to FIG. 7b, which is a circuit diagram of an m-th stage shift register of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The shift register of the gate drive circuit according to the embodiment includes a b-th transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb, i.e. the pull-up node Pa and the a-th output terminal 231.

The shift register of the gate drive circuit according to the embodiment further includes an h-th transistor Mh, the gate of the h-th transistor Mh is connected to the gate of the e-th transistor Me, the source of the h-th transistor Mh is connected to the drain of the b-th transistor Mb, and the drain of the h-th transistor Mh is connected to the b-th input terminal 212.

According to the shift register in the embodiment, during a non-scanning stage of the shift register, in the case that a high level signal is input to the a-th clock terminal 221, the h-th transistor Mh is cut-off, a low level signal VGL input to the b-th input terminal 212 is input to Pa, the level of Pa during a non-outputting stage of the shift register is reduced several times with the change of the a-th clock terminal 221, thereby a stability of the shift register circuit is improved.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the gate drive circuit provided by the embodiment, the stability of the shift register circuit is improved, thereby the display effect is improved.

It should be noted that the start units shown in FIG. 5a, FIG. 6a and FIG. 7a are modifications on the basis of the start unit shown in FIG. 3a, the difference is that the start units shown in FIG. 5a, FIG. 6a and FIG. 7a further include one additional transistor. Similarly, the shift registers shown in FIG. 5b, FIG. 6b and FIG. 7b are modifications on the basis of the shift register shown in FIG. 3b, the difference is that the shift registers shown in FIG. 5b, FIG. 6b and FIG. 7b further include one additional transistor. However, in practice, the additional transistors may be combined. That is, multiple transistors may be added to the start unit shown in FIG. 3a and the shift register shown in FIG. 3b. The structure described in the embodiment is not intended to limit the present disclosure.

Figure 8A:
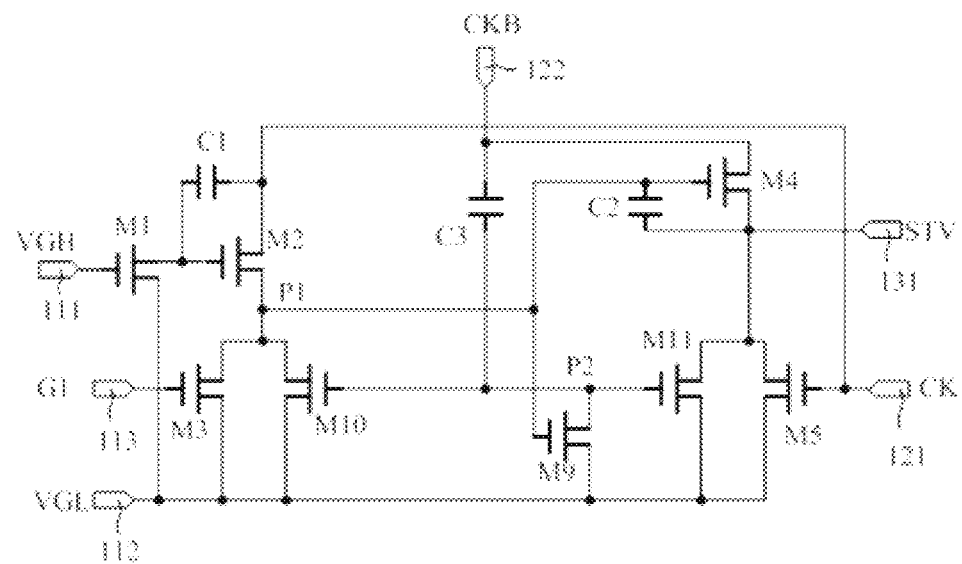
FIG. 8a is a circuit diagram of a start unit of another gate drive circuit according to the embodiment of the disclosure.

Reference is made to FIG. 8a, which is a circuit diagram of a start unit of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit, and the drain of the third transistor M3 is connected to the second input terminal 112. The gate of the fourth transistor M4 is connected to the drain of the second transistor M2 i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes a ninth transistor M9, a third capacitor C3, a tenth transistor M10 and an eleventh transistor M11. The gate of the ninth transistor M9 is connected to the drain of the second transistor M2 i.e. P1, the source of the ninth transistor M9 is connected to the second clock terminal 122 at a pull-down node P2, and the drain of the ninth transistor M9 is connected to the second input terminal 112. The third capacitor C3 is connected between the source of the ninth transistor M9 and the second clock terminal 122. The gate of the tenth transistor M10 is connected to the second clock terminal 122 i.e. P2, the source of the tenth transistor M10 is connected to the drain of the second transistor M2 i.e. P1, and the drain of the tenth transistor M10 is connected to the second input terminal 112. The gate of the eleventh transistor M11 is connected to the second clock terminal 122 i.e. P2, the source of the eleventh transistor M11 is connected to the first output terminal 131, and the drain of the eleventh transistor M11 is connected to the second input terminal 112.

According to the start unit in the embodiment, during a starting stage of the start unit and an outputting stage of the start unit, in the case that P1 is at a high level, the gate of the ninth transistor M9 is connected to P1, the ninth transistor M9 is turn-on, a low level signal VGL input to the second input terminal 112 is transmitted to P2, P2 is at a low level, the tenth transistor M10 and the eleventh transistor M11 the gates of which is connected to P2 are cut-off. In this case, for P1, the tenth transistor M10 is cut-off, the low level signal VGL may not be transmitted to P1 through the tenth transistor M10, hence, the level of P1 may not be affected by the low level signal VGL, thereby the stability of the potential of P1 is improved, and the stability of the output of the start unit is improved. For the first output terminal 131, the eleventh transistor M11 is cut-off, the low level signal VGL may not be transmitted to the first output terminal 131 through the eleventh transistor M11, hence, during the precharge stage of the start unit and the outputting stage of the start unit, the output signal of the first output terminal 131 may not be affected by the low level signal VGL, thereby the stability of the output of the start unit is improved.

During a non-scanning stage of the start unit, that is during and after a resetting stage of the start unit, P1 is at a low level, the ninth transistor M9 is cut-off since the gate of the ninth transistor M9 is connected to P1, the low level signal VGL input to the second input terminal 112 may not be transmitted to P2 through the ninth transistor M9. In this case, the level of P2 is the same as the second clock signal CKB of the second clock terminal 122. In the case that the second clock signal CKB is at a high level, the tenth transistor M10 and the eleventh transistor M11 are turn-on. For P1, the tenth transistor M10 is turn-on, the low level signal VGL is transmitted to P1 through the tenth transistor M10, hence, the level of P1 is reduced several times with the change of the second clock signal CKB, P1 maintains the low level during the non-scanning stage of the start unit, the fourth transistor M4 is cut-off, thereby the stability of the circuit is ensured. For the first output terminal 131, in the case that the second clock signal CKB is at a high level, the eleventh transistor M11 is turn-on, the low level signal VGL is transmitted to the first output terminal 131 through the eleventh transistor M11, hence, during the non-scanning stage of the start unit, the first output terminal 131 is at the low level and does not output signal, thereby the stability of the circuit during the non-scanning stage of the start unit is ensured.

It should be noted that, compared with the start unit shown in FIG. 3a, the start unit in the embodiment further includes the ninth transistor M9, the tenth transistor M10, the eleventh transistor M11 and the third capacitor C3. The stability of the circuit is improved by providing these electronic elements. However, the present embodiment is merely an example description, in practice, it is possible to add only part of these electronic elements. For example, the start units according to other embodiments of the disclosure may be obtained by adding the ninth transistor M9, the tenth transistor M10 and the third capacitor C3 to the start unit shown in FIG. 3a, or by adding the ninth transistor M9, the eleventh transistor M11 and the third capacitor C3 to the start unit shown in FIG. 3a. In this way, the stability of the circuit is enhanced. The circuit structure described in the embodiment is not intended to limit the present disclosure.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the start unit provided by the embodiment, the stability of the start unit circuit is improved, thereby the display effect is improved.

Figure 8B:
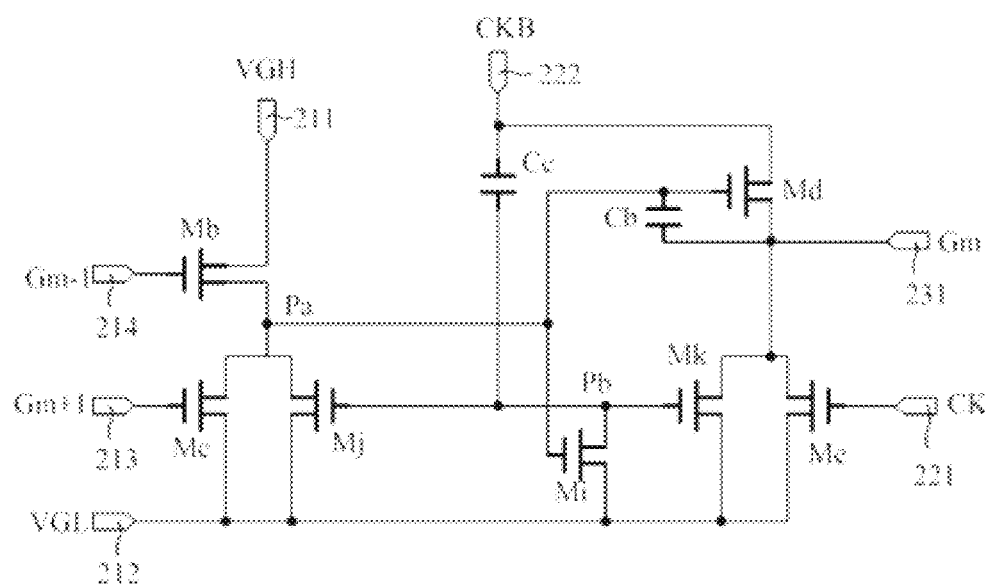
FIG. 8b is a circuit diagram of an m-th stage shift register of another gate drive circuit according to the embodiment of the disclosure.

Reference is made to FIG. 8b, which is a circuit diagram of an m-th stage shift register of another gate drive circuit according to the embodiment of the disclosure. The cascade diagram of the gate drive circuit according to the embodiment is the same as the cascade diagram of the gate drive circuit shown in FIG. 2, for the specific description, FIG. 2 and the related description may be referred to, which is not described herein, with the emphasis on the difference between the circuit structure of the gate drive circuit in the embodiment and the circuit structure of the gate drive circuit shown in FIG. 2.

The shift register of the gate drive circuit according to the embodiment includes a b-transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb, i.e. the pull-up node Pa and the a-th output terminal 231.

The shift register of the gate drive circuit according to the embodiment further includes an i-th transistor Mi, a c-th capacitor Cc, a j-th transistor Mj and a k-th transistor Mk. The gate of the i-th transistor Mi is connected to the drain of the b-th transistor Mb i.e. Pa, the source of the i-th transistor Mi is connected to the b-th clock terminal 222 at a pull-down node Pb, and the drain of the i-th transistor Mi is connected to the b-th input terminal 212. The c-th capacitor Cc is connected between the source of the i-th transistor Mi and the b-th clock terminal 222. The gate of the j-th transistor Mj is connected to the b-th clock terminal 222 i.e. Pb, the source of the j-th transistor Mj is connected to the drain of the b-th transistor Mb i.e. Pa, and the drain of the j-th transistor Mj is connected to the b-th input terminal 212. The gate of the k-th transistor Mk is connected to the b-th clock terminal 222 i.e. Pb, the source of the k-th transistor Mk is connected to the a-th output terminal 231, and the drain of the k-th transistor Mk is connected to the b-th input terminal 212.

According to the shift register in the embodiment, during a precharge stage of the shift register and an outputting stage of the shift register, in the case that Pa is at a high level, the gate of the i-th transistor Mi is connected to Pa, the i-th transistor Mi is turn-on, a low level signal VGL input to the b-th input terminal 212 is transmitted to Pb, Pb is at a low level, the j-th transistor Mj and the k-th transistor Mk the gates of which is connected to Pb are cut-off. In this case, for Pa, the j-th transistor Mj is cut-off, the low level signal VGL may not be transmitted to Pa through the j-th transistor Mj, hence, the level of Pa may not be affected by the low level signal VGL, thereby the stability of the level of Pa is improved, and the stability of the output of the shift register is improved. For the a-th output terminal 231, the k-th transistor Mk is cut-off, the low level signal VGL may not be transmitted to the a-th output terminal 231 through the k-th transistor Mk, hence, during the precharge stage of the shift register and the outputting stage of the shift register, the output signal of the a-th output terminal 231 may not be affected by the low level signal VGL, thereby the stability of the output of the shift register is improved.

During a non-scanning stage of the shift register, that is during and after a resetting stage of the shift register, Pa is at a low level, the i-th transistor Mi is cut-off since the gate of the i-th transistor Mi is connected to Pa, the low level signal VGL input to the b-th input terminal 212 may not be transmitted to Pb through the i-th transistor Mi. In this case, the level of Pb is the same as the second clock signal CKB of the b-th clock terminal 222. In the case that the second clock signal CKB is at a high level, the j-th transistor Mj and the k-th transistor Mk are turn-on. For Pa, the j-th transistor Mj is turn-on, the low level signal VGL is transmitted to Pa through the j-th transistor Mj, hence, the level of Pa is reduced several times with the change of the second clock signal CKB, Pa maintains the low level during the non-scanning stage of the shift register, the d-th transistor Md is cut-off, thereby the stability of the circuit is ensured. For the a-th output terminal 231, in the case that the second clock signal CKB is at a high level, the k-th transistor Mk is turn-on, the low level signal VGL is transmitted to the a-th output terminal 231 through the k-th transistor Mk, hence, during the non-scanning stage of the shift register, the a-th output terminal 231 is at the low level and does not output signal, thereby the stability of the circuit during the non-scanning stage of the shift register is ensured.

It should be noted that, compared with the shift register shown in FIG. 3b, the shift register in the embodiment further includes the i-th transistor Mi, the j-th transistor Mj, the k-th transistor Mk and the c-th capacitor Cc. The stability of the circuit is improved by providing these electronic elements. However, the present embodiment is merely an example description, in practice, it is possible to add only part of these electronic elements. For example, the shift registers according to other embodiments of the disclosure may be obtained by adding the i-th transistor Mi, the j-th transistor Mj and the c-th capacitor Cc to the shift register shown in FIG. 3b, or by adding the i-th transistor Mi, the k-th transistor Mk and the c-th capacitor Cc to the shift register shown in FIG. 3b. In this way, the stability of the circuit is enhanced. The circuit structure described in the embodiment is not intended to limit the present disclosure.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the shift register provided by the embodiment, the stability of the shift register circuit is improved, thereby the display effect is improved.

Figure 9:
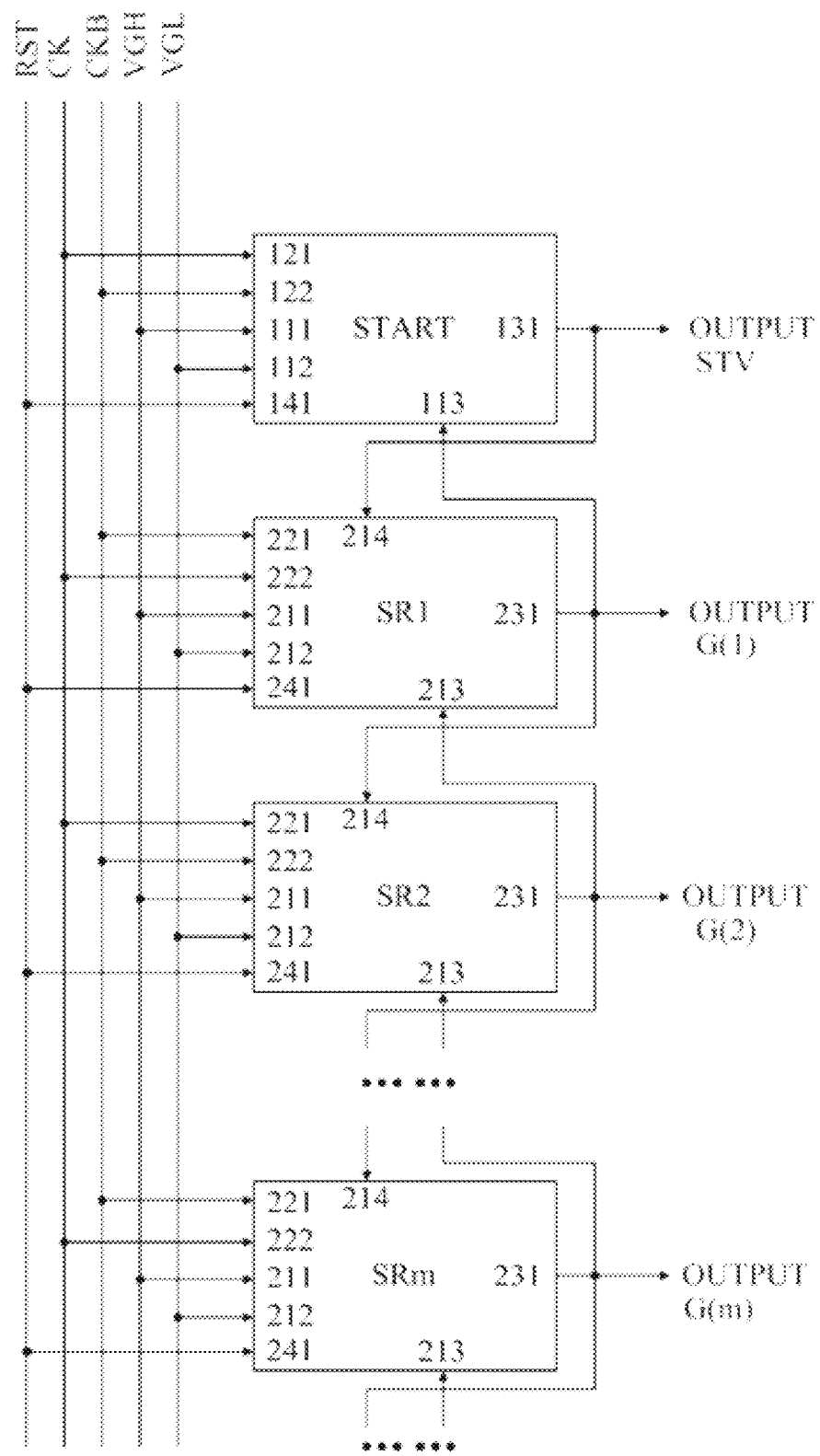
FIG. 9 is a cascade diagram of another gate drive circuit according to the embodiment of the disclosure.

Reference is made to FIG. 9, which is a cascade diagram of another gate drive circuit according to the embodiment of the disclosure. Comparing FIG. 9 with FIG. 2, it may be seen that the gate drive circuit according to the embodiment is similar to the gate drive circuit shown in FIG. 2. The same part between the circuit structure of the gate drive circuit in the embodiment and the circuit structure of the gate drive circuit shown in FIG. 2 is not described herein, with the emphasis on the difference between them.

Referring to FIG. 9, the gate drive circuit according to the embodiment further includes a reset controller configured to generate a reset signal RST. The start unit of the gate drive circuit according to the embodiment further includes a first reset input terminal 141 connected to the reset controller to input the reset signal RST for resetting the start unit after the outputting stage of the start unit. Similarly, the shift register of the gate drive circuit according to the embodiment further includes an a-th reset input terminal 241 connected to the reset controller to input the reset signal for resetting each of the shift registers after the outputting stage of the shift register.

Figure 10A:
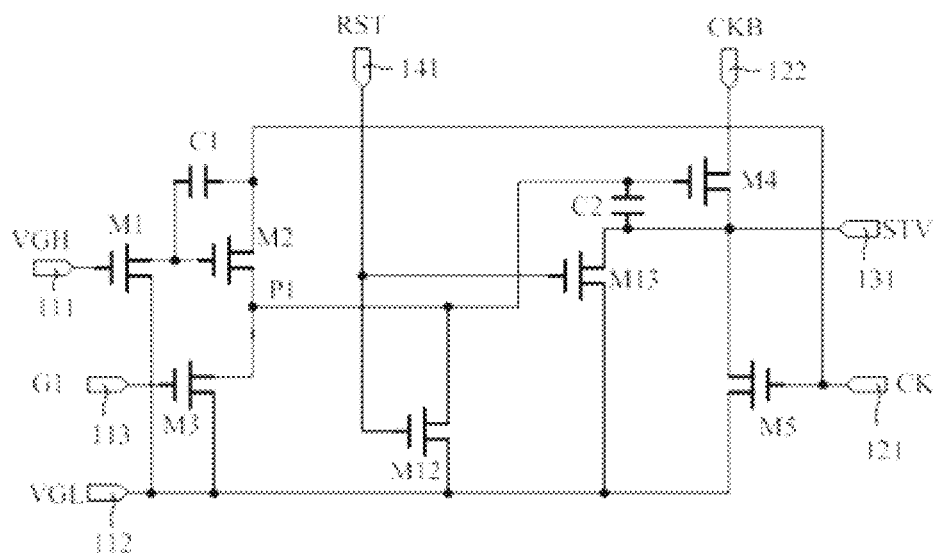
FIG. 10a is a circuit diagram of a start unit of the gate drive circuit in FIG. 9.
Figure 10B:
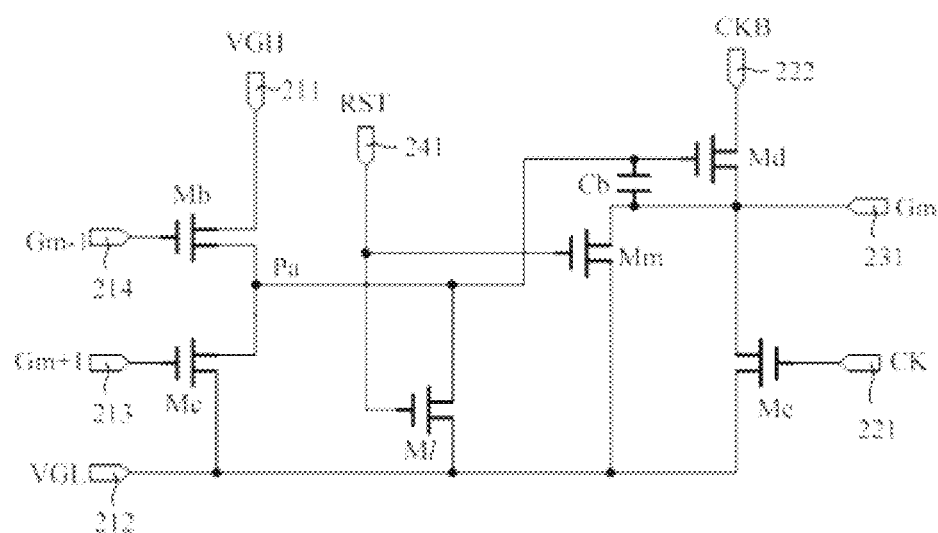
FIG. 10b is a circuit diagram of an m-th stage shift register of the gate drive circuit in FIG. 9.

More specifically, referring to FIG. 10a and FIG. 10b. FIG. 10a is a circuit diagram of a start unit of the gate drive circuit in FIG. 9, and FIG. 10b is a circuit diagram of an m-th stage shift register of the gate drive circuit in FIG. 9.

Referring to FIG. 9 and FIG. 10a, the start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit, and the drain of the third transistor M3 is connected to the second input terminal 112. The gate of the fourth transistor M4 is connected to the drain of the second transistor M2 i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes a twelfth transistor M12 and a thirteenth transistor M13. The gate of the twelfth transistor M12 is connected to the first reset input terminal 141, the source of the twelfth transistor M12 is connected to the drain of the second transistor M2 i.e. P1, and the drain of the twelfth transistor M12 is connected to the second input terminal 112. The gate of the thirteenth transistor M13 is connected to the first reset input terminal 141, the source of the thirteenth transistor M13 is connected to the first output terminal 131, and the drain of the thirteenth transistor M13 is connected to the second input terminal 112.

According to the start unit in the embodiment, the reset controller generates a reset signal RST and inputs the reset signal RST to the start unit through the first reset input terminal 141 before the scan of each frame i.e. during the starting stage of the start unit. The reset signal RST is a high level signal, the twelfth transistor M12 and the thirteenth transistor M13 are turn-on in the case that the reset signal RST is input. In this case, for P1, the twelfth transistor M12 is turn-on, the low level signal VGL is transmitted to P1 through the twelfth transistor M12, the reset of P1 is completed before the scanning stage of the start unit. That is, before scanning each frame, there may be residual charge at P1, only the level of P1 to which the clock signal is input is reset during the resetting stage of the start unit, the residual charge always exists, thereby resulting in a bad display performance such as a figured screen on the display panel. In the case that the start unit is reset before the frame, the low level signal VGL is transmitted to P1 through the twelfth transistor M12, the residual charge may be removed, thereby improving the bad display performance. Similarly, for the first output terminal 131, after the reset signal RST is input, the thirteenth transistor M13 is turn-on, the low level signal VGL is transmitted to the first output terminal 131, the reset of the first output terminal 131 is completed before the frame, thereby improving the bad display performance.

It should be noted that, compared with the start unit shown in FIG. 3a, the start unit in the embodiment further includes the twelfth transistor M12 and the thirteenth transistor M13. The stability of the circuit is improved by providing these electronic elements, thereby the bad display performance is improved. However, the present embodiment is merely an example description, in practice, it is possible to add only one transistor of these electronic elements. That is, the start units according to other embodiments of the disclosure may be obtained by adding only the twelfth transistor M12 to the start unit shown in FIG. 3a, or by adding only the thirteenth transistor M13 to the start unit shown in FIG. 3a. In this way, the stability of the circuit is enhanced, thereby the bad display performance is improved. The circuit structure described in the embodiment is not intended to limit the present disclosure.

Referring to FIG. 9 and FIG. 10b, the shift register of the gate drive circuit according to the embodiment includes a b-th transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb, i.e. the pull-up node Pa and the a-th output terminal 231.

The shift register of the gate drive circuit according to the embodiment further includes an l-th transistor Ml and an m-th transistor Mm. The gate of the l-th transistor Ml is connected to the a-th reset input terminal 241, the source of the l-th transistor Ml is connected to the drain of the b-th transistor Mb i.e. Pa, and the drain of the l-th transistor Ml is connected to the b-th input terminal 212. The gate of the m-th transistor Mm is connected to the a-th reset input terminal 241, the source of the m-th transistor Mm is connected to the a-th output terminal 231, and the drain of the m-th transistor Mm is connected to the b-th input terminal 212.

According to the shift register in the embodiment, the reset controller generates a reset signal RST and inputs the reset signal RST to the each of the shift registers through the a-th reset input terminal 241 before the scan of each frame, i.e. during the starting stage of the start unit. The reset signal RST is a high level signal, the l-th transistor Ml and the m-th transistor Mm are turn-on in the case that the reset signal RST is input. In this case, for Pa, the l-th transistor Ml is turn-on, the low level signal VGL is transmitted to Pa through the l-th transistor Ml, the reset of Pa is completed before the scanning stage of the shift register. That is, before scanning each frame, there may be residual charge at Pa, only the level of Pa to which the clock signal is input is reset during the resetting stage of the shift register, the residual charge always exists, thereby resulting in a bad display performance such as a figured screen on the display panel. In the case that the shift register is reset before the frame, the low level signal VGL is transmitted to Pa through the l-th transistor Ml, the residual charge may be removed, thereby improving the bad display performance. Similarly, for the a-th output terminal 231, after the reset signal RST is input, the m-th transistor Mm is turn-on, the low level signal VGL is transmitted to the a-th output terminal 231, the reset of the a-th output terminal 231 is completed before the frame, thereby improving the bad display performance.

It should be noted that, compared with the shift register shown in FIG. 3b, the shift register in the embodiment further includes the l-th transistor Ml and the m-th transistor Mm. The stability of the circuit is improved by providing these electronic elements, thereby the bad display performance is improved. However, the present embodiment is merely an example description, in practice, it is possible to add only one transistor of these electronic elements. That is, the shift registers according to other embodiments of the disclosure may be obtained by adding only the l-th transistor Ml to the shift register shown in FIG. 3b, or by adding only the m-th transistor Mm to the shift register shown in FIG. 3b. In this way, the stability of the circuit is enhanced, thereby the bad display performance is improved. The circuit structure described in the embodiment is not intended to limit the present disclosure.

It should be noted that, the start units and shift registers of the gate drive circuits according to other embodiments of the disclosure may not limited be the correspondence shown in FIG. 10a and FIG. 10b. For example, the start units of the gate drive circuits according to other embodiments of the disclosure may be obtained by adding the twelfth transistor M12 to the start unit shown in FIG. 3a. The shift registers of the gate drive circuits according to other embodiments of the disclosure may be obtained by adding the m-th transistor Mm to the shift register shown in FIG. 3b. That is, the start units and the shift registers of the gate drive circuits according to other embodiments of the disclosure may be obtained by adding non-correspondingly electronic elements to the gate drive circuit shown in FIG. 2.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the start unit and the shift register provided by the embodiment, the stability of the circuit is improved, thereby the bad display performance is improved.

Figure 11A:
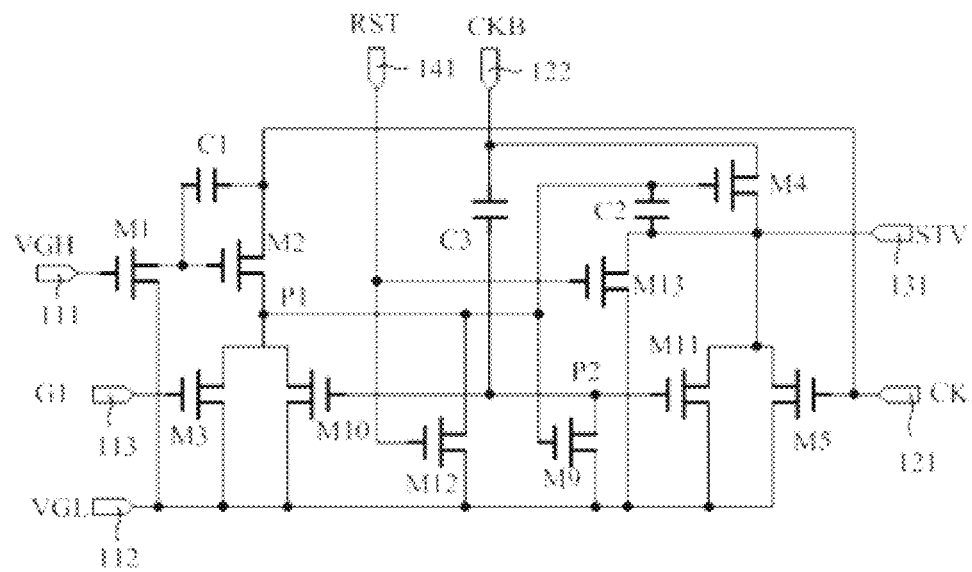
FIG. 11a is a circuit diagram of a start unit of another gate drive circuit according to the embodiment of the disclosure.

Reference is made to FIG. 11a, which is a circuit diagram of a start unit of another gate drive circuit according to the embodiment of the disclosure. The cascade diagram of the gate drive circuit according to the embodiment is the same as the cascade diagram of the gate drive circuit shown in FIG. 9, for the specific description, FIG. 9 and the related description may be referred to, which is not described herein, with the emphasis on the difference between the circuit structure of the gate drive circuit in the embodiment and the circuit structure of the gate drive circuit shown in FIG. 9.

Referring to FIG. 8a, FIG. 10a and FIG. 11a, the start unit shown in FIG. 11a is an improvement of the start unit based on the start units shown in FIG. 8a and FIG. 10a. The start unit of the gate drive circuit according to the embodiment includes a first transistor M1, a second transistor M2, a first capacitor C1, a third transistor M3, a fourth transistor M4, a fifth transistor M5 and a second capacitor C2. A gate of the first transistor M1 is connected to a first input terminal 111, and a drain of the first transistor M1 is connected to a second input terminal 112. The gate of the second transistor M2 is connected to a source of the first transistor M1, and the source of the second transistor M2 is connected to a first clock terminal 121. The first capacitor C1 is connected between the source of the first transistor M1 and the first clock terminal 121. The gate of the third transistor M3 is connected to a third input terminal 113, the source of the third transistor M3 is connected to the drain of the second transistor M2 at a pull-up node P1 of the start unit, and the drain of the third transistor M3 is connected to the second input terminal 112. The gate of the fourth transistor M4 is connected to the drain of the second transistor M2, i.e. the pull-up node P1, the source of the fourth transistor M4 is connected to a second clock terminal 122, and the drain of the fourth transistor M4 is connected to a first output terminal 131. The gate of the fifth transistor M5 is connected to the first clock terminal 121, the source of the fifth transistor M5 is connected to the first output terminal 131, and the drain of the fifth transistor M5 is connected to the second input terminal 112. The second capacitor C2 is connected between the drain of the second transistor M2 i.e. the pull-up node P1 and the first output terminal 131.

The start unit of the gate drive circuit according to the embodiment further includes a ninth transistor M9, a third capacitor C3, a tenth transistor M10 and an eleventh transistor M11. The gate of the ninth transistor M9 is connected to the drain of the second transistor M2 i.e. P1, the source of the ninth transistor M9 is connected to the second clock terminal 122 at a pull-down node P2, and the drain of the ninth transistor M9 is connected to the second input terminal 112. The third capacitor C3 is connected between the source of the ninth transistor M9 and the second clock terminal 122. The gate of the tenth transistor M10 is connected to the second clock terminal 122, i.e. P2, the source of the tenth transistor M10 is connected to the drain of the second transistor M2 i.e. P1, and the drain of the tenth transistor M10 is connected to the second input terminal 112. The gate of the eleventh transistor M11 is connected to the second clock terminal 122 i.e. P2, the source of the eleventh transistor M11 is connected to the first output terminal 131, and the drain of the eleventh transistor M11 is connected to the second input terminal 112.

The start unit of the gate drive circuit according to the embodiment further includes a twelfth transistor M12 and a thirteenth transistor M13. The gate of the twelfth transistor M12 is connected to the first reset input terminal 141, the source of the twelfth transistor M12 is connected to the drain of the second transistor M2, i.e. P1, and the drain of the twelfth transistor M12 is connected to the second input terminal 112. The gate of the thirteenth transistor M13 is connected to the first reset input terminal 141, the source of the thirteenth transistor M13 is connected to the first output terminal 131, and the drain of the thirteenth transistor M13 is connected to the second input terminal 112.

The function of the added electronic element in the start unit according to the embodiment with respect to the start unit shown in FIG. 3a is the same as the function of the corresponding electronic element shown in FIG. 8a and FIG. 10a, which is not limited herein. It should be noted that the start unit according to the embodiment is similar to the start units according to other embodiments, the start unit according to the embodiment may be obtained by adding a part of the above electronic elements or all the above electronic elements to the start unit shown in FIG. 3a, which is not limited herein.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the start unit provided by the embodiment, the stability of the start unit circuit is improved, thereby the display effect is improved, and the bad display performance is improved.

Figure 11B:
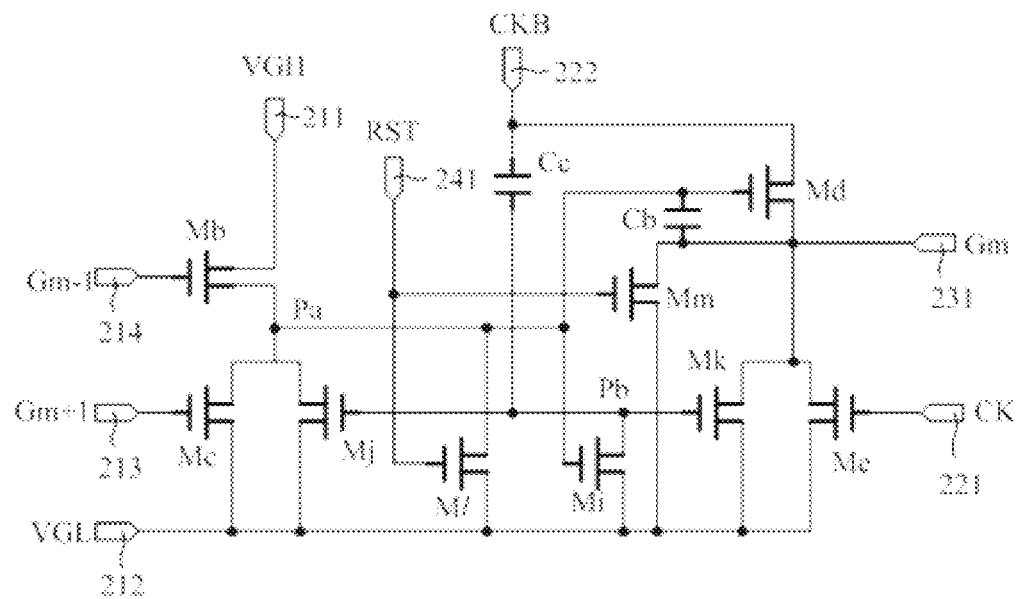
FIG. 11b is a circuit diagram of an m-th stage shift register of another gate drive circuit according to the embodiment of the disclosure.

Reference is made to FIG. 11b, which is a circuit diagram of an m-th stage shift register of another gate drive circuit according to the embodiment of the disclosure. The cascade diagram of the gate drive circuit according to the embodiment is the same as the cascade diagram of the gate drive circuit shown in FIG. 9, for the specific description, FIG. 9 and the related description may be referred to, which is not described herein, with the emphasis on the difference between the circuit structure of the gate drive circuit in the embodiment and the circuit structure of the gate drive circuit shown in FIG. 9.

Referring to FIG. 8b, FIG. 10b and FIG. 11b, the shift register shown in FIG. 11b is an improvement of the shift register based on the shift registers shown in FIG. 8b and FIG. 10b. The shift register of the gate drive circuit according to the embodiment includes a b-th transistor Mb, a c-th transistor Mc, a d-th transistor Md, an e-th transistor Me and a b-th capacitor Cb. A gate of the b-th transistor Mb is connected to a d-th input terminal 214, and a source of the b-th transistor Mb is connected to an a-th input terminal 211. The gate of the c-th transistor Mc is connected to a c-th input terminal 213, the source of the c-th transistor Mc is connected to a drain of the b-th transistor Mb at a pull-up node Pa of the shift register, and the drain of the c-th transistor Mc is connected to a b-th input terminal 212. The gate of the d-th transistor Md is connected to the drain of the b-th transistor Mb i.e. the pull-up node Pa, the source of the d-th transistor Md is connected to a b-th clock terminal 222, and the drain of the d-th transistor Md is connected to an a-th output terminal 231. The gate of the e-th transistor Me is connected to an a-th clock terminal 221, the source of the e-th transistor Me is connected to the a-th output terminal 231, and the drain of the e-th transistor Me is connected to the b-th input terminal 212. The b-th capacitor Cb is connected between the drain of the b-th transistor Mb, i.e. the pull-up node Pa and the a-th output terminal 231.

The shift register of the gate drive circuit according to the embodiment further includes an i-th transistor Mi, a c-th capacitor Cc, a j-th transistor Mj and a k-th transistor Mk. The gate of the i-th transistor Mi is connected to the drain of the b-th transistor Mb, i.e. Pa, the source of the i-th transistor Mi is connected to the b-th clock terminal 222 at a pull-down node Pb, and the drain of the i-th transistor Mi is connected to the b-th input terminal 212. The c-th capacitor Cc is connected between the source of the i-th transistor Mi and the b-th clock terminal 222. The gate of the j-th transistor Mj is connected to the b-th clock terminal 222, i.e. Pb, the source of the j-th transistor Mj is connected to the drain of the b-th transistor Mb, i.e. Pa, and the drain of the j-th transistor Mj is connected to the b-th input terminal 212. The gate of the k-th transistor Mk is connected to the b-th clock terminal 222 i.e. Pb, the source of the k-th transistor Mk is connected to the a-th output terminal 231, and the drain of the k-th transistor Mk is connected to the b-th input terminal 212.

The shift register of the gate drive circuit according to the embodiment further includes an l-th transistor Ml and an m-th transistor Mm. The gate of the l-th transistor Ml is connected to the a-th reset input terminal 241, the source of the l-th transistor Ml is connected to the drain of the b-th transistor Mb i.e. Pa, and the drain of the l-th transistor Ml is connected to the b-th input terminal 212. The gate of the m-th transistor Mm is connected to the a-th reset input terminal 241, the source of the m-th transistor Mm is connected to the a-th output terminal 231, and the drain of the m-th transistor Mm is connected to the b-th input terminal 212.

The function of the added electronic element in the shift register according to the embodiment with respect to the shift register shown in FIG. 3b is the same as the function of the corresponding electronic element shown in FIG. 8b and FIG. 10b, which is not limited herein. It should be noted that the shift register according to the embodiment is similar to the shift register s according to other embodiments, the shift register according to the embodiment may be obtained by adding a part of the above electronic elements or all the above electronic elements to the shift register shown in FIG. 3b, which is not limited herein.

According to the gate drive circuit provided by the embodiment, the initial pulse signal generated by a jump of the high level controller is input to the start unit, the start unit generates the start signal and inputs the start signal to the shift register. In this way, it is unnecessary to individually provide a start signal line, thereby the number of the signal lines in a border region is reduced, a width of the signal lines in the border region of an array substrate is reduced, a border size of a product is reduced, and a display effect of the product is improved. According to the shift register provided by the embodiment, the stability of the shift register circuit is improved, thereby the display effect is improved, and the bad display performance is improved.

The above content is the detailed description of the disclosure made in conjunction with the specific preferred embodiments, the embodiment of the disclosure may not be limited to the above description. For the skilled in the art, several simple deductions and substitutions may also be made without departing from the concept of the disclosure. Those deductions and substitutions should also be included in the scope of protection of the present disclosure.

What is claimed is:

1. A gate drive circuit, comprising:
    M cascaded shift registers, wherein M is a natural number;
    a clock controller, configured to generate two reverse-phase clock signals;
    a high level controller configured to generate a high level signal;
    a low level controller configured to generate a low level signal,
    wherein one of the high level controller and the low level controller is configured to generate an initial pulse signal during an initial stage; and
    a start unit cascaded with the M shift registers, wherein the start unit is configured to provide a start signal to the shift registers.

2. The gate drive circuit according to claim 1, wherein:
    the start unit comprises a first input terminal and a second input terminal;
    one of:
        the first input terminal is connected to the high level controller and is configured to receive the high level signal and the initial pulse signal, wherein the initial pulse signal is a low level pulse signal, and the second input terminal is connected to the low level controller and is configured to receive the low level signal, and
        the first input terminal is connected to the low level controller and is configured to receive the low level signal and the initial pulse signal, wherein the initial pulse signal is a high level pulse signal, and the second input terminal is connected to the high level controller and is configured to receive the high level signal;
    the start unit further comprises:
        a third input terminal,
        a first clock terminal and a second clock terminal, wherein the first clock terminal is connected to the clock controller and is configured to receive one of the two reverse-phase clock signals, and wherein the second clock terminal is connected to the clock controller and is configured to receive the other one of the two reverse-phase clock signals, and
        a first output terminal;
    the shift register comprises:
        an a-th input terminal connected to the high level controller or the low level controller to which the first input terminal is connected,
        a b-th input terminal connected to the high level controller or the low level controller to which the second input terminal is connected,
        a c-th input terminal,
        a d-th input terminal, wherein the d-th input terminal of a first stage shift register is connected to the first output terminal to input the start signal,
        an a-th clock terminal and a b-th clock terminal, wherein the a-th clock terminal is connected to the clock controller and is configured to receive one of the two reverse-phase clock signals, and wherein the b-th clock terminal is connected to the clock controller and is configured to receive the other one of the two reverse-phase clock signals, and
        an a-th output terminal, wherein the a-th output terminal of the first stage shift register is connected to the third input terminal, wherein the a-th output terminal of each of the shift registers other than the first stage shift register is connected to the c-th input terminal of a former stage shift register, and wherein the a-th output terminal of each of the shift registers is connected to the d-th input terminal of a latter stage shift register.

3. The gate drive circuit according to claim 2, wherein the start unit comprises:
    a first transistor, wherein a gate of the first transistor is connected to the first input terminal, and wherein a drain of the first transistor is connected to the second input terminal;
    a second transistor, wherein a gate of the second transistor is connected to a source of the first transistor, and wherein a source of the second transistor is connected to the first clock terminal; and
    a first capacitor connected between the source of the first transistor and the first clock terminal.

4. The gate drive circuit according to claim 3, wherein:
    the start unit comprises:
        a third transistor, wherein a gate of the third transistor is connected to the third input terminal, wherein a source of the third transistor is connected to the drain of the second transistor, and wherein a drain of the third transistor is connected to the second input terminal, a fourth transistor, wherein a gate of the fourth transistor is connected to the drain of the second transistor, wherein a source of the fourth transistor is connected to the second clock terminal, and wherein a drain of the fourth transistor is connected to the first output terminal, a fifth transistor, wherein a gate of the fifth transistor is connected to the first clock terminal, wherein a source of the fifth transistor is connected to the first output terminal, and wherein a drain of the fifth transistor is connected to the second input terminal, and a second capacitor connected between the drain of the second transistor and the first output terminal;

the shift register comprises:

a b-th transistor, wherein a gate of the b-th transistor is connected to the d-th input terminal, and wherein a source of the b-th transistor is connected to the a-th input terminal, a c-th transistor, wherein a gate of the c-th transistor is connected to the c-th input terminal, wherein a source of the c-th transistor is connected to a drain of the b-th transistor, and wherein a drain of the c-th transistor is connected to the b-th input terminal, a d-th transistor, wherein a gate of the d-th transistor is connected to the drain of the b-th transistor, wherein a source of the d-th transistor is connected to the b-th clock terminal, and wherein a drain of the d-th transistor is connected to the a-th output terminal;

an e-th transistor, wherein a gate of the e-th transistor is connected to the a-th clock terminal, wherein a source of the e-th transistor is connected to the a-th output terminal, and wherein a drain of the e-th transistor is connected to the b-th input terminal, and a b-th capacitor connected between the drain of the b-th transistor and the a-th output terminal.

5. The gate drive circuit according to claim 4, wherein the start unit further comprises a sixth transistor, wherein a gate and a source of the sixth transistor are connected, wherein the gate of the sixth transistor is connected to the first clock terminal, and wherein a drain of the sixth transistor is connected to the gate of the fifth transistor.

6. The gate drive circuit according to claim 4, wherein the shift register further comprises an f-th transistor, wherein a gate and a source of the f-th transistor are connected, wherein the gate of the f-th transistor is connected to the a-th clock terminal, and wherein a drain of the f-th transistor is connected to the gate of the e-th transistor.

7. The gate drive circuit according to claim 4, wherein the start unit further comprises a seventh transistor, wherein a gate of the seventh transistor is connected to the drain of the second transistor, wherein a source of the seventh transistor is connected to the gate of the fifth transistor, and wherein a drain of the seventh transistor is connected to the second input terminal.

8. The gate drive circuit according to claim 4, wherein the shift register further comprises a g-th transistor, wherein a gate of the g-th transistor is connected to the drain of the b-th transistor, wherein a source of the g-th transistor is connected to the gate of the e-th transistor, and wherein a drain of the g-th transistor is connected to the b-th input terminal.

9. The gate drive circuit according to claim 4, wherein the start unit further comprises an eighth transistor, wherein a gate of the eighth transistor is connected to the gate of the fifth transistor, wherein a source of the eighth transistor is connected to the drain of the second transistor, and wherein a drain of the eighth transistor is connected to the second input terminal.

10. The gate drive circuit according to claim 4, wherein the shift register further comprises an h-th transistor, wherein a gate of the h-th transistor is connected to the gate of the e-th transistor, wherein a source of the h-th transistor is connected to the drain of the b-th transistor, and wherein a drain of the h-th transistor is connected to the b-th input terminal.

11. The gate drive circuit according to claim 4, wherein the start unit further comprises:

a ninth transistor, wherein a gate of the ninth transistor is connected to the drain of the second transistor, wherein a source of the ninth transistor is connected to the second clock terminal, and wherein a drain of the ninth transistor is connected to the second input terminal; and a third capacitor connected between the source of the ninth transistor and the second clock terminal.

12. The gate drive circuit according to claim 4, wherein the shift register further comprises:

an i-th transistor, wherein a gate of the i-th transistor is connected to the drain of the b-th transistor, wherein a source of the i-th transistor is connected to the b-th clock terminal, and wherein a drain of the i-th transistor is connected to the b-th input terminal; and a c-th capacitor connected between the source of the i-th transistor and the b-th clock terminal.

13. The gate drive circuit according to claim 11, wherein the start unit further comprises a tenth transistor, wherein a gate of the tenth transistor is connected to the second clock terminal, wherein a source of the tenth transistor is connected to the drain of the second transistor, and wherein a drain of the tenth transistor is connected to the second input terminal.

14. The gate drive circuit according to claim 12, wherein the shift register further comprises a j-th transistor, wherein a gate of the j-th transistor is connected to the b-th clock terminal, wherein a source of the j-th transistor is connected to the drain of the b-th transistor, and wherein a drain of the j-th transistor is connected to the b-th input terminal.

15. The gate drive circuit according to claim 11, wherein the start unit further comprises an eleventh transistor, wherein a gate of the eleventh transistor is connected to the second clock terminal, wherein a source of the eleventh transistor is connected to the first output terminal, and wherein a drain of the eleventh transistor is connected to the second input terminal.

16. The gate drive circuit according to claim 12, wherein the shift register further comprises a k-th transistor, wherein a gate of the k-th transistor is connected to the b-th clock terminal, wherein a source of the k-th transistor is connected to the drain of the a-th output terminal, and wherein a drain of the k-th transistor is connected to the b-th input terminal.

17. The gate drive circuit according to claim 4, further comprising a reset controller configured to generate a reset signal, wherein the start unit further comprises a first reset input terminal connected to the reset controller and configured to receive the reset signal, and wherein the shift register further comprises an a-th reset input terminal connected to the reset controller and configured to receive the reset signal.

18. The gate drive circuit according to claim 17, wherein the start unit further comprises a twelfth transistor, wherein a gate of the twelfth transistor is connected to the first reset input terminal, wherein a source of the twelfth transistor is connected to the drain of the second transistor, and wherein a drain of the twelfth transistor is connected to the second input terminal.

19. The gate drive circuit according to claim 17, wherein the shift register further comprises an l-th transistor, wherein a gate of the l-th transistor is connected to the a-th reset input terminal, wherein a source of the l-th transistor is connected to the drain of the b-th transistor, and wherein a drain of the l-th transistor is connected to the b-th input terminal.

20. The gate drive circuit according to claim 17, wherein the start unit further comprises a thirteenth transistor, wherein a gate of the thirteenth transistor is connected to the first reset input terminal, wherein a source of the thirteenth transistor is connected to the first output terminal, and wherein a drain of the thirteenth transistor is connected to the second input terminal.

21. The gate drive circuit according to claim 17, wherein the shift register further comprises an m-th transistor, wherein a gate of the m-th transistor is connected to the a-th reset input terminal, wherein a source of the m-th transistor is connected to the a-th output terminal, and wherein a drain of the m-th transistor is connected to the b-th input terminal.

22. A drive method for driving a gate drive circuit, wherein the gate drive circuit comprises:
   M cascaded shift registers, wherein M is a natural number;
   a clock controller, configured to generate two reverse-phase clock signals;
   a high level controller configured to generate a high level signal;
   a low level controller configured to generate a low level signal,
   wherein one of the high level controller and the low level controller is configured to generate an initial pulse signal during an initial stage; and
   a start unit cascaded with the M shift registers, wherein the start unit is configured to provide a start signal to the shift registers,
   wherein the drive method comprises:
      inputting the initial pulse signal and the two reverse-phase clock signals to the start unit during a starting stage of the start unit; and
      inputting the high level signal/low level signal and the two reverse-phase clock signals to the start unit during an outputting stage of the start unit.

23. The drive method according to claim 22, wherein the start unit comprises a first clock terminal and a second clock terminal, wherein a signal received by the first clock terminal is reverse-phase with the initial pulse signal, and a signal received by the second clock terminal is in-phase with the initial pulse signal.

* * * * *